(12) United States Patent
Takata et al.

(10) Patent No.: US 6,262,910 B1
(45) Date of Patent: Jul. 17, 2001

(54) SEMICONDUCTOR MEMORY DEVICE HAVING A FERROELECTRIC MEMORY CAPACITOR

(75) Inventors: Hidekazu Takata; Kengo Maeda, both of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/417,274

(22) Filed: Oct. 13, 1999

(30) Foreign Application Priority Data

Oct. 13, 1998 (JP) .................................................. 10-291064

(51) Int. Cl.[7] .................................................... G11C 11/12
(52) U.S. Cl. .................... 365/145; 365/149; 365/230.06; 365/117; 365/205; 365/189.01
(58) Field of Search .................................... 368/145, 149, 368/230.06, 117, 203, 189.01

(56) References Cited

U.S. PATENT DOCUMENTS

| | | | |
|---|---|---|---|
| 5,517,446 | * 5/1996 | Ihara | 365/145 |
| 5,574,679 | * 11/1996 | Ohtsuki et al. | 365/145 |
| 5,703,804 | * 12/1997 | Takata et al. | 365/145 |
| 5,798,964 | 8/1998 | Shimizu et al. | 365/145 |
| 5,959,878 | * 9/1999 | Kamp | 365/117 |
| 5,978,250 | * 11/1999 | Chung et al. | 365/145 |
| 6,034,884 | * 3/2000 | Jung | 365/145 |

FOREIGN PATENT DOCUMENTS

| | | |
|---|---|---|
| 0 709 851 A2 | 5/1996 | (EP) . |
| 0 709 851 A3 | 5/1996 | (EP) . |
| 08124379 | 5/1996 | (JP) . |

* cited by examiner

*Primary Examiner*—David Nelms
*Assistant Examiner*—Connie C. Yoha
(74) *Attorney, Agent, or Firm*—Morrison & Foerster LLP

(57) ABSTRACT

A switching transistor is provided which applies predetermined voltage to a plurality of word lines based on a predetermined signal from a power on reset circuit, until predetermined potential becomes stable, when the predetermined potential is applied to the bit line or to the plate line, such as at the time of power on, to connect the bit line connected to each memory cell and the memory cell capacitor, as well as applies a control signal to the gate to thereby electrically connect the bit line and the plate line.

27 Claims, 26 Drawing Sheets

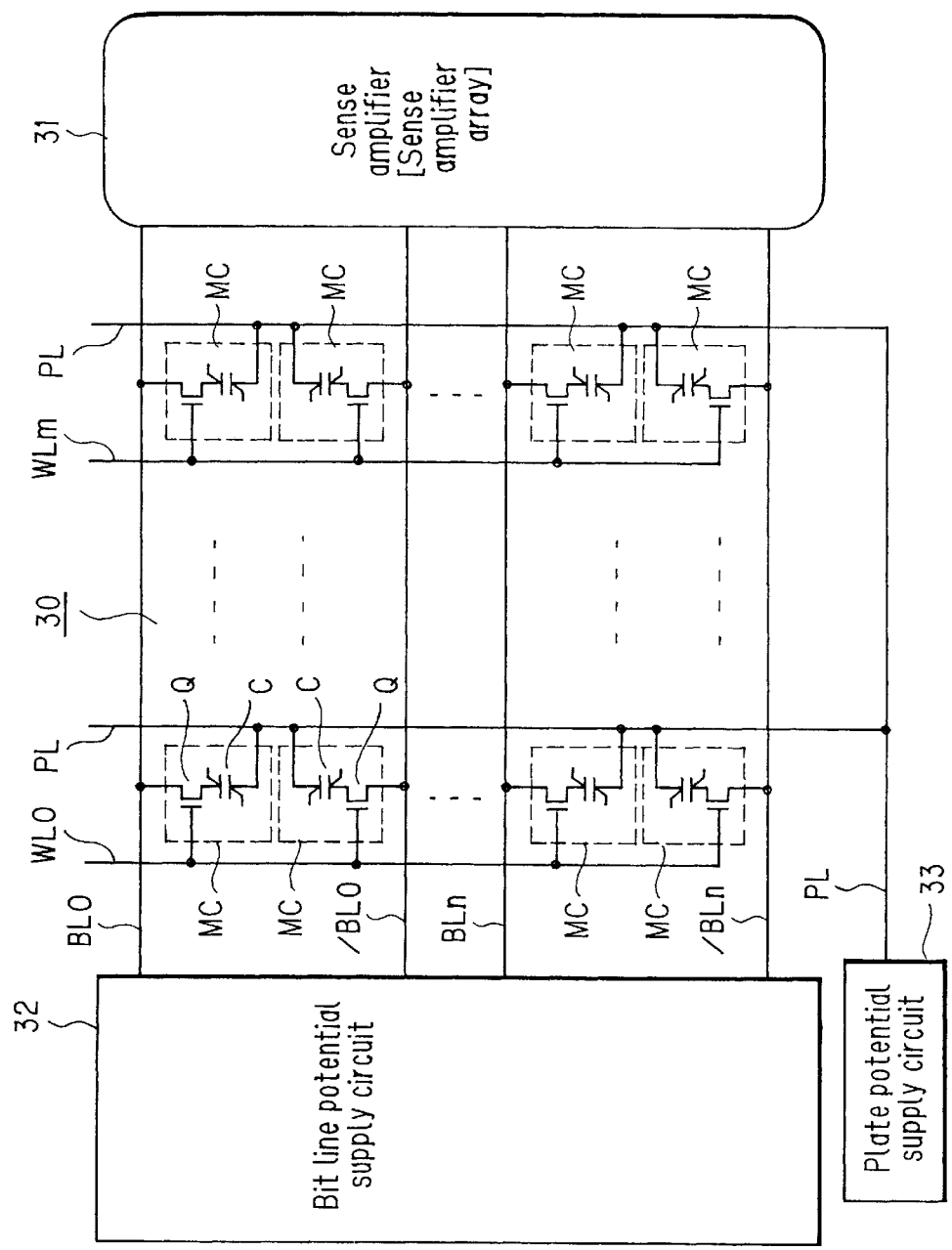

Voltage change at the time of power on and at the time of power down mode

SEMICONDUCTOR MEMORY DEVICE HAVING A FERROELECTRIC MEMORY CAPACITOR

BACKGROUND OF THE INVENTION (1) Field of the Invention

The present invention relates to a semiconductor memory device, and more specifically, relates to a nonvolatile semiconductor memory device for storing information depending upon a polarization state of a ferroelectric material intervening between ferroelectric capacitor electrodes.

(2) Description of the Related Art

As follows is a description of a conventional ferroelectric memory device with reference to FIG. 1.

Memory cells MC arranged in an array have a capacitance C for storing information make use of ferroelectric material (hereinafter referred to as "capacitor C") and a MOS transistor Q, respectively, and are arranged in a matrix so as to form a memory cell array 30 to enable to write, read and erase of the information of the memory cell MC.

With the memory cell array 30, to a word line (WL0, WL1 . . . ) is connected in common a gate terminal of the transistor Q of the memory cell MC in the same column, and to a plate line (PL0, PL1 . . . ) is connected in common one of the electrodes of the capacitor C of the memory cell in the same column, and word lines WL and plate lines PL are alternately arranged one by one.

Moreover, a bit line (BL0, /BL0, BL1, /BL1 . . . ) is connected in common to either the drain or source of the transistor of the memory cell in the same row. Therefore, memory cells are arranged in a matrix as a whole, corresponding to nodes of bit lines BL, /BL, word lines WL and plate lines PL.

In FIG. 1, of a plurality of bit lines arranged in parallel to each other in the row direction, a pair of adjacent bit lines BL and /BL are shown together with a construction in the vicinity thereof. With respect to a bit line BL of the pair of bit lines BL and /BL, the other bit line /BL is also referred to as a "complementary bit line". In the following description (including the drawings), as a symbol showing the complementary bit line, there is used "/BL" or "BL" with an upper line "¯", but both of them are used in the same meaning.

One end of the bit line BL and the complementary bit line /BL extending in the row direction of the memory cell MC is connected to a sense amplifier 31 for amplifying and detecting the potential difference between the bit line BL and the complementary bit line /BL.

Moreover, as shown in FIG. 1, the above described each bit line BL, /BL and plate line PL are connected to a bit line potential supply circuit 32 and a plate potential supply circuit 33, respectively, for supplying optional predetermined potential for each line, and a plurality of memory cells MC are connected between the above described adjacent bit line BL and /BL.

Next is a description of a method for writing binary data "1" in a conventional memory cell having the above described memory array construction, taking an example of a method for giving optional certain potential to the plate line PL in FIG. 2A.

The method for writing data "1" is performed in the following manner, as shown in FIG. 2A. That is to say, positive power supply voltage Vcc is supplied to a bit line BL corresponding to a memory cell MC to be written, and at the same time, potential of the ground level is supplied to a complementary bit line /BL. Then a corresponding word line WL is set to "H" level, and MOS transistors Q1 and Q2 included in the memory cell MC to be written are made "ON", that is, drain and source are connected to supply the power supply voltage Vcc to one of the electrodes of a capacitor C1.

Here, optional predetermined potential Vp has been already supplied to a corresponding plate line PL, since the power is switched on, and voltage at a level corresponding to the power supply voltage Vcc is applied to the bit line BL, to thereby generate electric field EVcc1, occurring between the both electrodes of capacitor C1, at a level determined by subtracting the predetermined potential Vp of the plate line PL from Vcc. With this electric field, electric charge corresponding to the polarization Ps1 shown in FIG. 3A is stored in the capacitor C1 to thereby store the polarization state.

On the other hand, since voltage of the ground potential level has been supplied to the complementary bit line /BL, electric field EVcc2 of a level subtracting the ground potential from the optional predetermined potential Vp of the plate line PL is generated between both electrodes of the capacitor C2. With this electric field, polarization Ps2 shown in FIG. 2A is stored in the capacitor C2 to thereby store the polarization information.

When the word line WL is made "OFF", since optional predetermined potential Vp has been supplied to the plate line PL, it is necessary to make the potential of the opposite pole equal. Therefore, it is necessary to periodically refresh the electrode of the capacitor C1 on the side connected to the bit line BL and to periodically refresh the electrode of the capacitor C2 on the side connected to the complementary bit line /BL.

In this case, if it is assumed that both poles of the capacitor have the same potential, the electric field between both poles becomes 0, and polarization Pr1 (FIG. 3A) remains in the capacitor C1, and polarization Pr2 (FIG. 4A) remains in the capacitor C2.

Moreover, when the power supply voltage Vcc is not provided (specifically, when the power supply voltage Vcc is 0V), the potential of both poles of the capacitor is the ground potential level, and polarization Pr is stored.

In the above description, write of data "1" has been explained. Write of data "0" is realized by reversing the voltage level supplied to the bit line BL and the complementary bit line /BL in the case of data "1" described above. That is to say, the ground potential level is supplied to the bit line BL, and the power supply voltage Vcc is supplied to the complementary bit line /BL, thereby residual polarization Pr1 remains in the capacitor C2, contrary to the case of writing the above data "1", and residual polarization Pr2 remains in the capacitor C1. Hence, data "0" is written in the memory cell.

Furthermore, read of the written data is performed as described below.

First, prior to the read operation, as shown in FIG. 2B, the bit line BL and the complementary bit line /BL are discharged to the ground potential level, then subsequently, the potential of the word line WL is made to be "H" level, to thereby make the MOS transistors Q1 and Q2 ON, to start the read operation. At this time, the potential of the plate line PL is always the optional predetermined potential Vp.

Then, in the case of reading data "1", the MOS transistor Q1 is ON, and the voltage of the ground potential level applied to the capacitor C1, to thereby generate the electric field in the opposite direction to that of the write case between the potential Vp of the plate line PL and the capacitor C1. Thereby, the polarization state of the ferroelectric film included therein is inverted, to inverse the storage state of polarization in the capacitor C1.

On the other hand, since the electric field in the same direction as that of the write case is formed in the capacitor C2, polarization of the ferroelectric film included therein is not inverted. Hence, inversion of the storage state of polarization in the capacitor C2 is not caused. However, the storage amount of polarization changes slightly, with application of the electric field.

Then, electric charge in an amount corresponding to the change of the stored polarization in the capacitors C1 and C2 flows into the bit line BL and the complementary bit line /BL. The potential of the bit line BL becomes slightly larger than that of the complementary bit line /BL, due to the difference in an amount of electric charge flowing therein. By amplifying and detecting the potential difference between the bit line BL and the complementary bit line /BL with the sense amplifier 31 in FIG. 1, the stored data "1" is read.

In the case of reading data "0", the electric field in the opposite direction to that of the write case is applied to the capacitor C2, due to the potential difference of the plate line PL, to thereby inverse the polarization of the ferroelectric film included therein, hence the storage state of polarization in the capacitor C2 is inverted.

On the other hand, since the electric field in the same direction as that of the write case is applied to the capacitor C1, polarization of the ferroelectric film included therein is not inverted. However, the storage amount of polarization changes slightly, with application of the electric field.

Then, electric charge in an amount corresponding to the change of the stored polarization in the capacitors C1 and C2 flows into the bit line BL and the complementary bit line /BL, respectively. The potential of the complementary bit line /BL becomes slightly larger than that of the bit line BL, due to the difference in the amount of electric charge flowing therein. By amplifying and detecting the potential difference between the bit line BL and the complementary bit line /BL with the sense amplifier 31 in FIG. 1, the stored data "0" is made readable.

However, as the polarization information, even if, for example, "1" is written, and residual polarization Pr1 remains, when the electric field Evcc1' (EVcc<0) opposite to the state that "1" is written is applied due to some reasons (for example, at the time of power on, when optional predetermined potential is supplied to an optional node connected to the memory cell capacitor), the hysteresis curve becomes smaller (FIG. 3B) than that of FIG. 3A showing the original hysteresis curve. Thereby, at the time of read, the electric charge quantity read by the bit line BL decreases to cause deterioration of the sense margin.

On the contrary, when the value of the above Evcc1' is large, there is a problem that inversion of polarization is caused to thereby write the opposite data (FIG. 3C).

Even in a case that "0" is written in the ferroelectric capacitor C, the above problems are caused, that is, the hysteresis becomes smaller (FIG. 4B) relative to the original hysteresis (FIG. 4A), or erroneous write is caused (FIG. 4C).

To solve the above described problems, heretofore, Japanese Unexamined Patent Publication No. Hei 8-124379 discloses a semiconductor memory device in which a memory cell array 42 is provided with an erroneous write preventing circuit 41 which makes the word line WL and the bit line BL have the same potential only at the time of power on, using a power on reset circuit 40 outlined in FIG. 5.

With the above described semiconductor memory device, the power on reset circuit 40 is so constructed as to generate a power on signal PWRON which becomes "H" level for a certain period of time at the time of power on. With the power on signal PWRON, a bit line potential generation circuit and an SSR circuit (not shown) are controlled to thereby control the occurrence of respective potentials (VBL, VBB and the like), and meaningless access at the time of power on is prevented by controlling stop and release of the operation of an access control circuit (not shown).

Moreover, the erroneous write preventing circuit 41 is for preventing inversion of polarization and failure of memory data in a memory cell in the ferroelectric memory cell MC with the power on signal PWRON generated by the power on reset circuit 40, and transistors Q1 and Q2 for switches are connected between at least all bit lines BL and predetermined potential nodes (Vss in the drawing).

Therefore, by inputting the power on signal PWRON, for example, at "H" level for a certain period of time, at the time of power on, to each gate terminal of switching transistors Q, the same ground potential Vss is applied to all of plate lines PL and bit lines BL via the switching transistors Q1~Q2 to thereby prevent such problems as inversion of polarization and failure of memory data in the ferroelectric memory cell MC at the time of power on and at the time of resetting the power.

In the ferroelectric memory adopting the method where optional predetermined potential is applied to plate lines PL or bit lines BL, however, at the time of power on or at the time of returning from the power down mode, the MOS transistor Q becomes OFF (not connect), and external electric field is not applied to the memory retaining node of the ferroelectric capacitor C connected to the MOS transistor Q. Therefore, only polarization exists in the memory retaining node regardless of the state of the nonvolatile data, and its potential is in a floating state. Accordingly, when optional predetermined potential is applied to bit lines BL and plate lines PL, or at the time of power on or at the time of returning from the power down mode, and in the case of the plate line PL potential reaches to a certain level by noise caused carelessly, the potential of the memory retaining node follows the potential of plate line PL and changes because of coupling of the ferroelectric capacitor. Due to the parasitic capacity of the memory retaining node, however, potential difference is caused between both ends of the capacitor C, hence there is a possibility of causing erroneous write.

Furthermore, as shown in FIG. 5, it is necessary to prepare switching transistors Q1 and Q2 for each bit line BL side and plate line PL side, resulting in a problem of increasing the area of the memory cell array.

SUMMARY OF THE INVENTION

With a view to solving the above described problems, it is an object of the present invention to effectively provide a semiconductor memory device which prevents erroneous write caused at the time of power on, with a simple construction.

The present invention has the following construction to attain the above objects.

A first aspect of the present invention is a semiconductor memory device wherein a memory cell array formed by arranging memory cells, each having a memory capacitor adopting a ferroelectric film and aMOS transistor, in a matrix, has such a construction that:

gates of the MOS transistors in the same column are connected to the same word line;

one of the source and the drain of the MOS transistors in the same row is connected to the same bit line, and the other is connected to one electrode of the memory capacitor;

the other electrode of the memory capacitor is connected to a plate line; and a plurality of memory capacitors are selected in the plate line in the column direction or in the row direction;

the semiconductor memory device comprising:

a gate voltage supply section which supplies predetermined voltage to the gates of the MOS transistors connected to the word line, at the time of power on, to activate the MOS transistors and to connect the bit line and one electrode of the memory capacitor, so that the bit line and the electrode of the memory capacitor have the same potential by the MOS transistor; and a potential control section which makes the potential of the bit line and the plate line the same so that both poles of the memory capacitor have the same potential.

A second aspect of the present invention is a semiconductor memory device wherein a memory cell array formed by arranging memory, each cells having a memory capacitor adopting a ferroelectric film and a MOS transistor, in a matrix, has such a construction that:

one electrode of the memory capacitor is connected to a plate line;

gates of the MOS transistors in the same column are connected to the same word line;

one of the source and the drain of the MOS transistors in the same row is connected to the same bit line, and the other is connected to the other electrode of the memory capacitor; and a plurality of memory capacitors are selected in the plate line in the column direction or in the row direction;

the semiconductor memory device comprising:

a gate voltage supply section which supplies predetermined voltage to the gates of the MOS transistors connected to the word line to activate the MOS transistors and to connect the bit line and one electrode of the memory capacitor, so that the bit line and the electrode of the memory capacitor have the same potential via the MOS transistor, after power on, and when the plate line or the bit line supplied with the predetermined voltage is returned from a power down mode for reducing the electric power consumption to the optional predetermined potential again, regardless of being at the time of operation or in the standby state; and a potential control section which makes the potential of the bit line and the plate line the same so that both poles of the memory capacitor have the same potential.

A third aspect of the present invention is a semiconductor memory device according to the aspect 1 or 2, wherein the potential control section is a switching transistor for controlling conducting/non-conducting of current, and by supplying predetermined voltage to the gate of the switching transistor to activate the switching transistor, the bit line and the plate line are connected so that the bit line and the plate line have the same potential.

A fourth aspect of the present invention is a semiconductor memory device according to the aspect 1 or 2, wherein the potential control section has a voltage supply circuit for supplying predetermined voltage and a switching transistor for supplying voltage from the voltage supply circuit to the bit line and/or the plate line; and predetermined voltage is supplied to the gate of the switching transistor to activate the switching transistor, so that the bit line and the plate line have the same potential.

A fifth aspect of the present invention is a semiconductor memory device according to the aspect 1 or 2, wherein the potential control section has a voltage supply circuit which supplies predetermined voltage to the bit line and the plate line, based on a power on detection signal sent out at the time of power on or at the time of returning from the power down mode, to thereby make the potential of both of the bit line and the plate line the same.

A sixth aspect of the present invention is a semiconductor memory device according to the aspect 1 or 2, wherein the potential control section formed by combining the potential control sections described in aspect 3 to 5 is used to make the potential of the bit line and the plate line the same.

A seventh aspect of the present invention is a semiconductor memory device according to the aspect 3, wherein the gate voltage supply section is a power on reset circuit which supplies predetermined output voltage to at least one word line connected to the gate of the MOS transistor, at the time of power on, or for a predetermined period of time since returning from the power down mode, to activate the MOS transistor to thereby connect the bit line and the electrode of the memory capacitor, and also supplies predetermined output voltage to the gate of the switching transistor to activate the switching transistor to thereby make the potential of both poles of the memory capacitor the same.

An eighth aspect of the present invention is a semiconductor memory device according to the aspect 4, wherein the gate voltage supply section is a power on reset circuit which supplies predetermined output voltage to at least one word line connected to the gate of the MOS transistor, at the time of power on, or for a predetermined period of time since returning from the power down mode, to activate the MOS transistor to thereby connect the bit line and the electrode of the memory capacitor, and also supplies predetermined output voltage to the gate of the switching transistor to activate the switching transistor to thereby make the potential of both poles of the memory capacitor the same.

A ninth aspect of the present invention is a semiconductor memory device according to the aspect 5, wherein the gate voltage supply section is a power on reset circuit which supplies predetermined output voltage to at least one word line connected to the gate of the MOS transistor, at the time of power on, or for a predetermined period of time since returning from the power down mode, to activate the MOS transistor to thereby connect the bit line and the electrode of the memory capacitor, and also supplies a power on detection signal to the voltage supply circuit to supply predetermined voltage to the bit line and the plate line so that the potential of both lines becomes the same.

A tenth aspect of the present invention is a semiconductor memory device according to one of the aspect from 7 to 9, wherein the power on reset circuit has a boosting circuit for boosting the output voltage up to the power supply voltage or higher.

According to the invention of the aspect 1 and 2, at the time of power on, or at the time of returning from the power down mode to the optional predetermined potential again, predetermined voltage is supplied to the gates of the MOS transistors connected to the word line by means of the gate voltage supply section to activate the MOS transistors, so that the bit line connected to the source or drain of the MOS transistor is connected to one electrode of the memory capacitor.

Moreover, when the potential of the bit line and the plate line are made the same by means of the voltage control section, the bit line connected to one electrode of the memory capacitor (via the MOS transistor) and the plate line connected to the other electrode thereof have the same potential.

Thereby, at the time of power on or at the time of returning from the power down mode to the optional predetermined potential again, the potential polarity of the memory retaining node of the memory capacitor which is likely to be changed is clamped to the same potential, to thereby prevent inversion of the polarization direction of the memory capacitor at an undesirable timing, hence failure of the memory state can be prevented.

According to the invention of the aspect 3, the potential control section of the aspect 1 or 2 is a switching transistor for controlling conducting/non-conducting of current, and by supplying predetermined voltage to the gate to activate the switching transistor, the bit line and the plate line can be easily connected so that the bit line and the plate line becomes the same potential. Hence, at the time of power on or at the time of returning from the power down mode to the optional predetermined voltage again, inversion of the polarization direction of the memory capacitor at an undesirable timing can be prevented, to thereby prevent failure of the memory state with a simple device.

According to the invention of the aspect 4, the voltage control section of the aspect 1 or 2 has a voltage supply circuit for supplying predetermined voltage and a switching transistor for supplying voltage from the voltage supply circuit to the bit line and/or the plate line, and predetermined voltage is supplied to the gate of the switching transistor to activate the switching transistor. Hence, the bit line and the plate line have the same potential, so that at the time of power on or at the time of returning from the power down mode to the optional predetermined voltage again, inversion of the polarization direction of the memory capacitor at an undesirable timing can be prevented, to thereby prevent failure of the memory state with a simple device.

According to the invention of the aspect 5, the voltage control section of the aspect 1 or 2 is a voltage supply circuit which supplies predetermined voltage to the bit line and the plate line and make the potential of both lines the same, based on a power on detection signal sent out at the time of power on or at the time of returning from the power down mode, to thereby prevent inversion of the polarization direction of the memory capacitor at an undesirable timing, at the time of power on or at the time of returning from the power down mode to the optional predetermined voltage again, hence failure of the memory state can be prevented with a simple device.

According to the invention of the aspect 6, by using the potential control sections described in the aspect 3 to 5 in combination, the bit line and the plate line can be made to have the same potential for general-purposes.

According to the invention of the aspect 7 and 8, predetermined output voltage is supplied to at least one word line connected to the gate of the MOS transistor, at the time of power on, or for a predetermined period of time since returning from the power down mode, to activate the MOS transistor to thereby connect the bit line and the electrode of the memory capacitor, hence the MOS transistor can be activated by a simple device utilizing the existing word line.

Moreover, the MOS transistor and the switching transistor can be activated synchronously, to make the device more efficient and controllable. Hence, inversion of the polarization direction of the memory capacitor at an undesirable timing can be prevented at high precision, at the time of power on or at the time of returning from the power down mode to the optional predetermined voltage again, to thereby prevent failure of the memory state.

According to the invention of the aspect 9, predetermined output voltage is supplied to at least one word line connected to the gate of the MOS transistor, at the time of power on, or for a predetermined period of time since returning from the power down mode, to activate the MOS transistor to thereby connect the bit line and the electrode of the memory capacitor, hence the MOS transistor can be activated by a simple device utilizing the existing word line.

Moreover, it becomes easy to synchronously control the supply of voltage to the gates of the MOS transistor and supply of the power on detection signal to the voltage supply circuit to thereby make the device more efficient and controllable. Hence, inversion of the polarization direction of the memory capacitor at an undesirable timing can be prevented at high precision, at the time of power on or at the time of returning from the power down mode to the optional predetermined voltage again, to thereby prevent failure of the memory state.

According to the invention of the aspect 10, by providing the boosting circuit in the power on reset circuit, it becomes possible to reliably control the MOS transistor and/or the switching transistor or the voltage supply circuit. Hence, both electrodes of the memory capacitor can be reliably made to have the same potential, at the time of power on or at the time of returning from the power down mode to the optional predetermined voltage again, to thereby protect the memory content of the memory capacitor.

BRIEF DESCRIPTION OF THE DRAWINGS

FIG. 1 is a diagram showing a typical memory cell array construction of a nonvolatile semiconductor memory device.

FIG. 9 is a time chart of the power supply voltage, supplied predetermined voltage, output voltage of a power on reset circuit, and a word line voltage of the semiconductor memory device according to an embodiment of the present invention, at the time of power on.

DESCRIPTION OF THE PREFERRED EMBODIMENTS

Figure 2A:
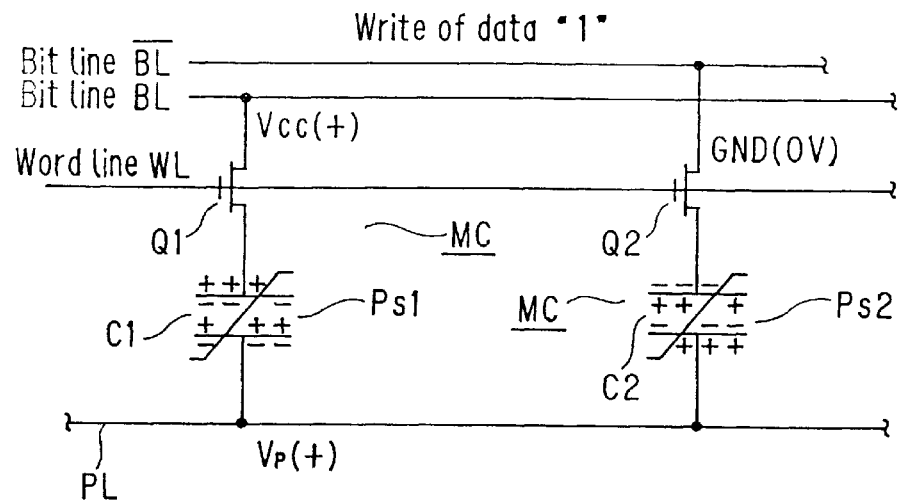
FIG. 2A is a diagram showing an example of write operation into a ferroelectric capacitor.
Figure 2B:
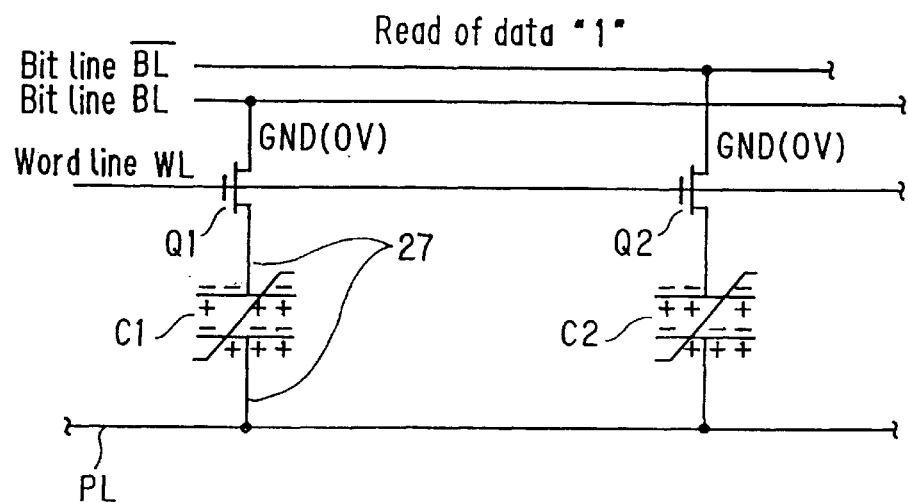
FIG. 2B is a diagram showing an example of read operation from the ferroelectric capacitor.
Figure 3A:
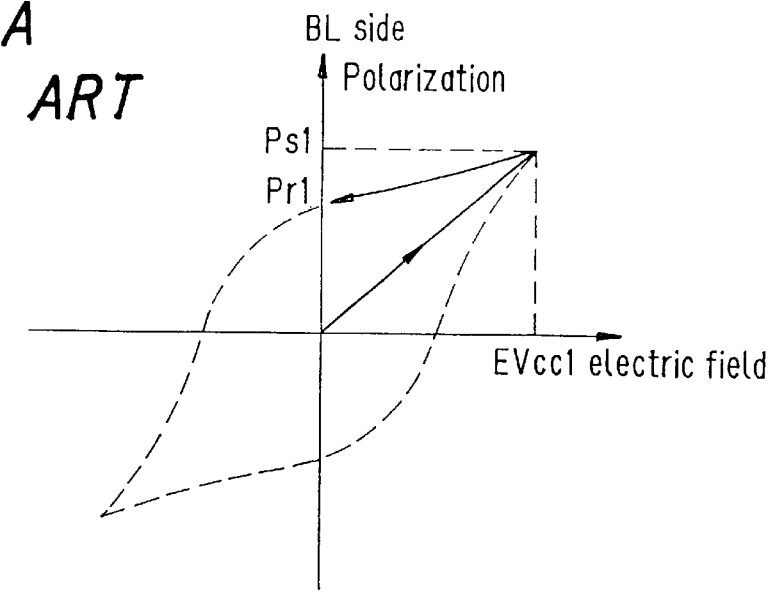
FIG. 3A shows a hysteresis of the ferroelectric capacitor C1 of FIGS. 2A and 2B.
Figure 3B:
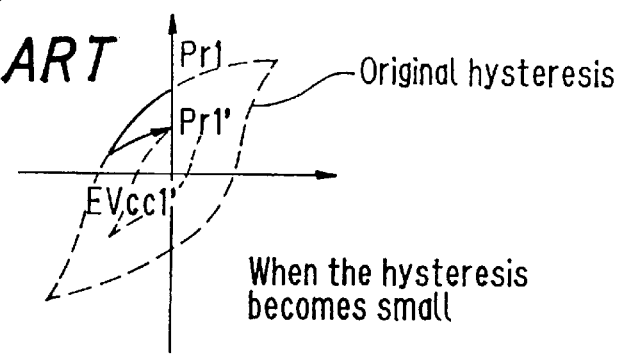
FIG. 3B shows a case where the hysteresis becomes small.
Figure 3C:
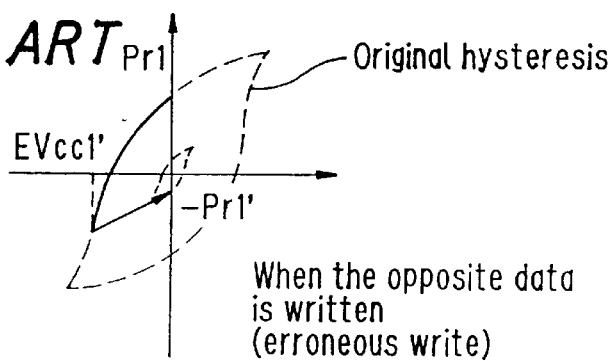
FIG. 3C shows a case of erroneous write.
Figure 4A:
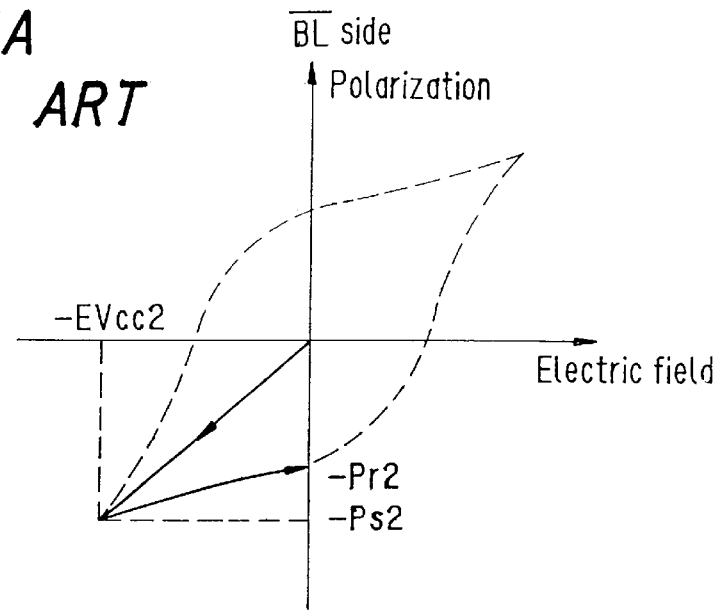
FIG. 4A shows a hysteresis of the ferroelectric capacitor C2 of FIGS. 2A and 2B.
Figure 4B:
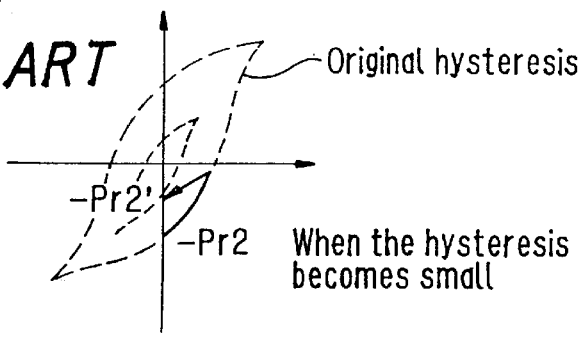
FIG. 4B shows a case where the hysteresis becomes small.
Figure 4C:
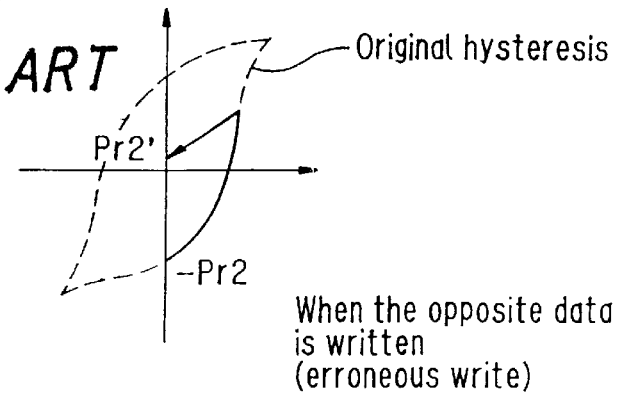
FIG. 4C shows a case of erroneous write.
Figure 5:
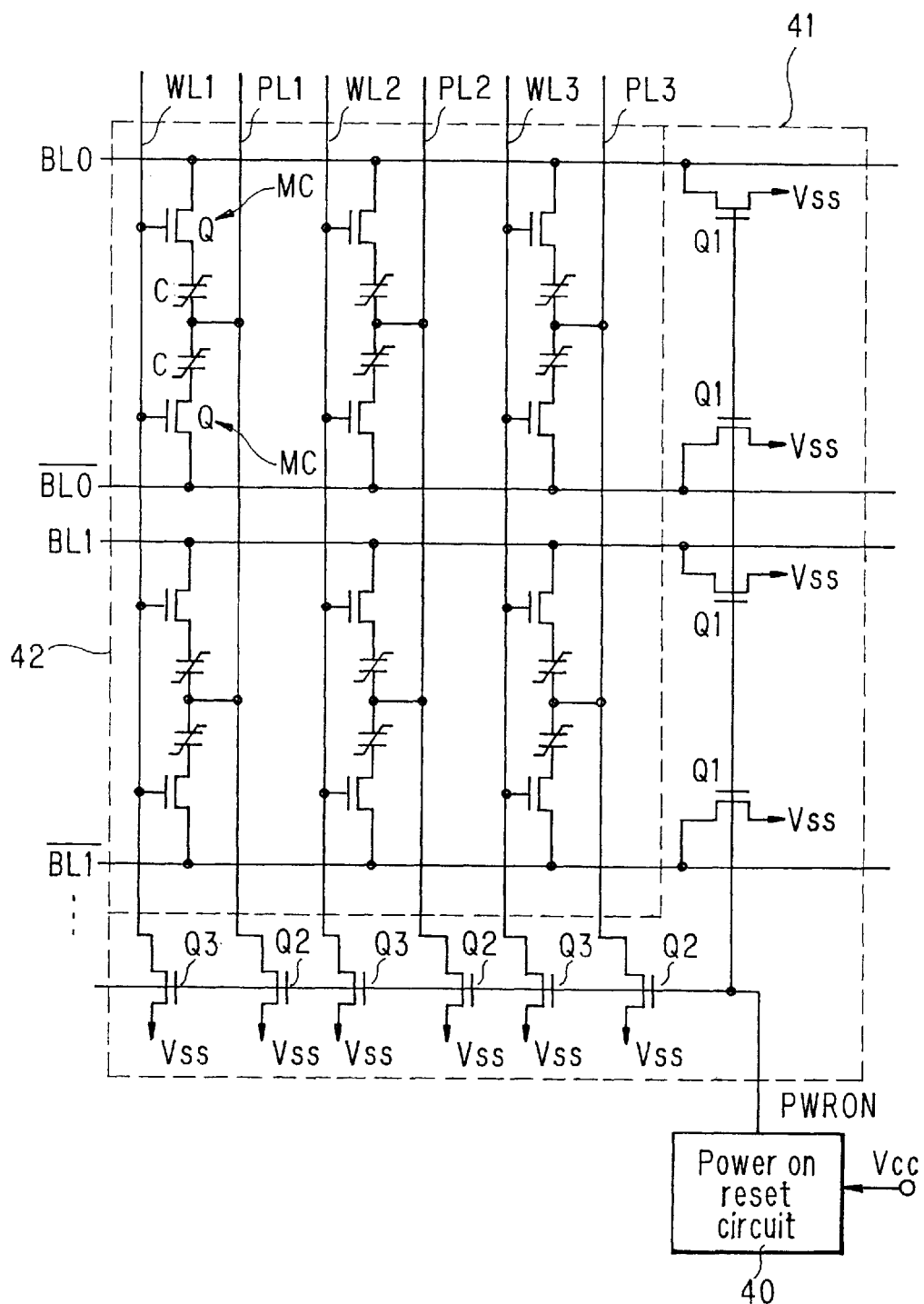
FIG. 5 is an elevational view of a conventional semiconductor memory device.

As follows is a detailed description of embodiments of the present invention with reference to the accompanying drawings. The same reference numerals are given to parts similar to those of the above described construction, and description thereof will be omitted.

Figure 6:
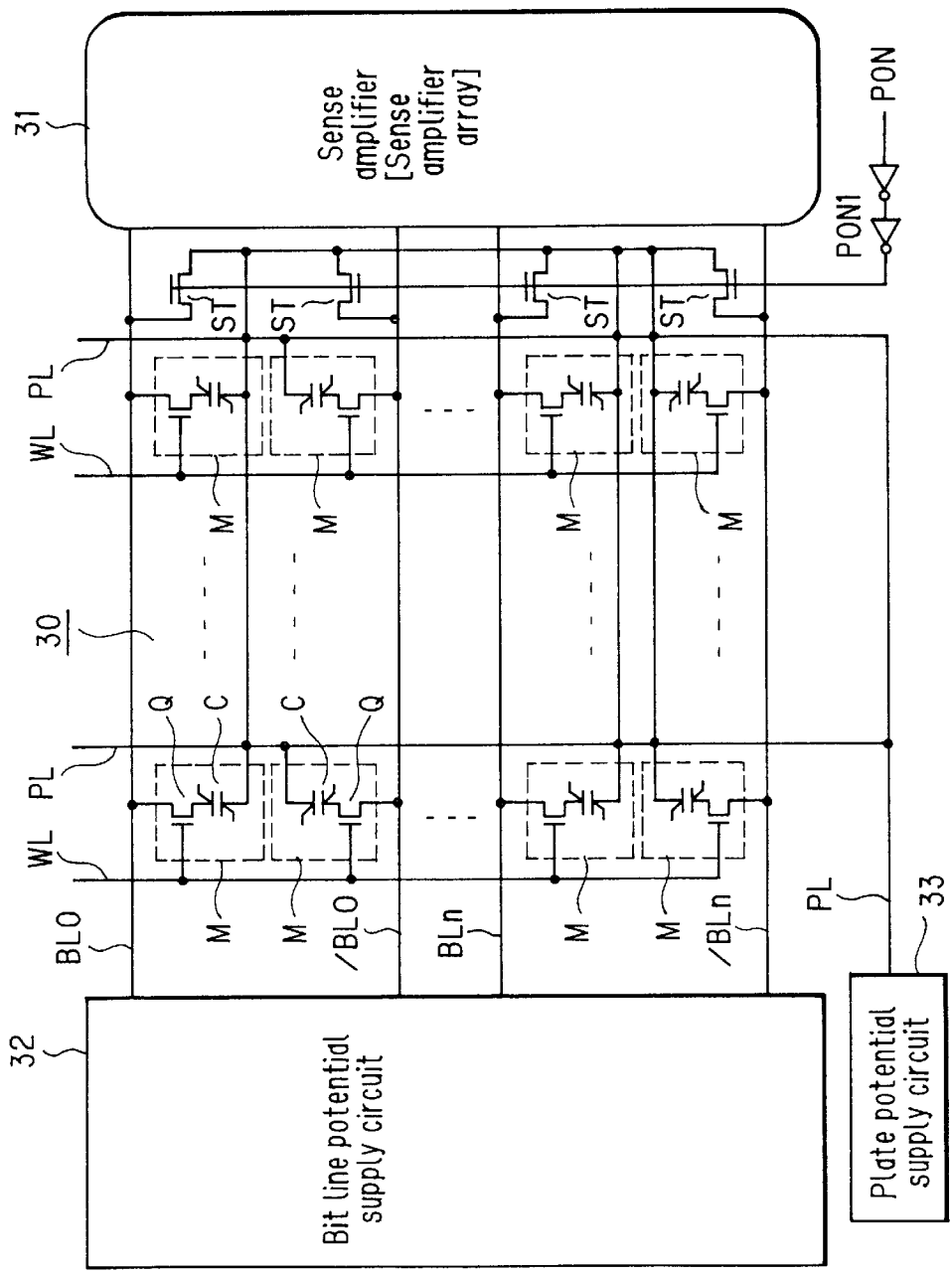
FIG. 6 is an elevational view of a semiconductor memory device according to an embodiment of the present invention.

A semiconductor memory device according to the embodiment shown in FIG. 6 has a similar construction as the semiconductor memory device shown in FIG. 1, for the convenience sake of explanation, wherein a plurality of bit lines BL and a plurality of word lines WL arranged in the direction crossing the bit lines BL are arranged on a substrate, and a plurality of memory cells M are arranged in a matrix at a point corresponding to each node of the bit lines BL and the word lines WL. Each memory cell M is provided with at least one transistor Q (for example, MOS transistor) and at least one ferroelectric capacitor C including a ferroelectric film as an insulation film, so that the memory cells M form a nonvolatile semiconductor memory device for storing information depending upon the polarization direction of the ferroelectric film.

Then, the gates of the MOS transistors Q in the same column are connected to the same word line WL, and either one of the source or drain of the MOS transistors Q in the same row is connected to the same bit line BL, the other thereof is connected to one electrode of the ferroelectric capacitor C, and the other electrode of the ferroelectric capacitor C is connected to the plate line PL, so that a plurality of ferroelectric capacitors C are selected in the plate line PL.

The semiconductor memory device according to this embodiment comprises a power on reset circuit 5 (FIG. 7), described later, for outputting predetermined voltage until the predetermined potential becomes stable, when the predetermined potential is supplied to the bit line BL or to the plate line PL, at the time of power on or at the time of returning from the power down mode, in addition to the conventional semiconductor memory device shown in FIG. 1. Based on a signal PON (FIG. 7) from the power on reset circuit 5, "H" level voltage is applied to at least one of the plurality of word lines WL shown in FIG. 6 so that the MOS transistor Q becomes ON (conductive), to thereby connect the bit line BL connected to the MOS transistor Q and the ferroelectric capacitor C.

Incidentally, the power down mode stands for an operation mode in which, after power on, the plate line PL or the bit line BL supplied with the predetermined voltage is made to have optional predetermined potential for reducing the electric power consumption, regardless of being during operation or being in a standby state.

Moreover, one switching transistor ST for electrically connecting the bit line BL and the plate line PL corresponding to the memory cells M in the same row by applying predetermined potential to the gate, based on the signal PON from the power on reset circuit 5 is provided for each bit line BL and each plate line PL corresponding to the memory cells M in each row.

The switching transistor ST is not limited to the above described arrangement, and the construction may be such that all bit lines BL and plate lines PL can be electrically connected by one switching transistor ST.

With the above construction, when predetermined potential is supplied to the bit line BL or plate line PL at the time of power on or at the time of returning from the power down mode, the bit line BL and one electrode of the ferroelectric capacitor C are connected until the predetermined potential becomes stable. In addition, the potential of the bit line BL and the plate line of the semiconductor memory device becomes the same. Hence, the electric field applied to the ferroelectric capacitor C is not changed, to thereby prevent the occurrence of polarization inversion, enabling prevention of erroneous write. This will be described in more detail.

Figure 7:
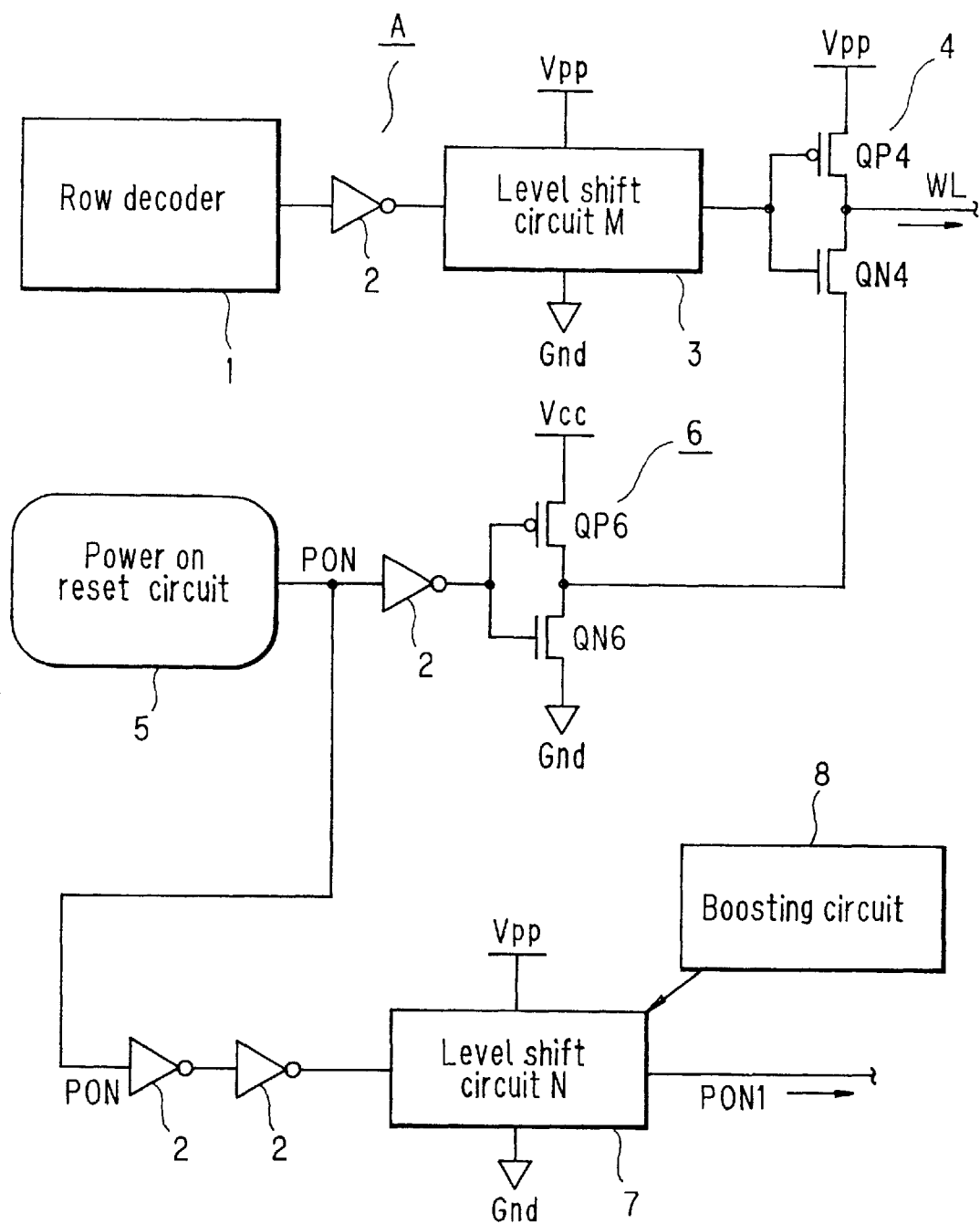
FIG. 7 is a block diagram showing the upstream portion of the semiconductor memory device according to an embodiment of the present invention.

FIG. 7 shows a circuit diagram showing the construction of the power on reset circuit 5 which outputs predetermined voltage until the predetermined potential becomes stable, when the predetermined potential is supplied to the bit line BL or plate line PL at the time of power on or at the time of returning from the power down mode, and a word line drive circuit A which applies "H" level voltage to at least one of the plurality of word lines WL, depending upon the signal PON synchronous to the output of the power on reset circuit 5.

The word line drive circuit A in FIG. 7 is provided with a row decoder 1, an inverter 2, a level shift circuit 3 and a pair of transistors 4 in series. The output of the level shift circuit 3 is, respectively, connected to gate terminals of a pair of N channel transistor QN4 and P channel transistor QP4 constituting the transistor pair 4.

The source terminal of the P channel transistor QP4 is connected to the power supply Vpp, the source terminal of the N channel transistor QN4 is connected to output-side of a pair of transistors 6 described later, and the output terminal (drain terminal) of the transistor pair 4 is connected to the word line WL.

The power on reset circuit 5 is a signal output circuit for outputting a predetermined output voltage signal (hereinafter, this node is referred to as "POM"), until the bit line BL or the plate line PL has stable predetermined potential, at the time of power on of the device or at the time of returning from the power down mode, as described above. The output terminal of the power on reset circuit 5 is respectively connected to gate terminals of a pair of N channel transistor QN6 and P channel transistor QP6 constituting the transistor pair 6, respectively, via the inverter 2.

The source terminal of the P channel transistor QP6 is connected to the power supply Vcc, the source terminal of the N channel transistor QN6 is earthed, and the output terminal (drain terminal) of the transistor pair 6 is connected to the source terminal of the N channel transistor QN4.

Moreover, the output terminal of the power on reset circuit 5 is connected to a level shift circuit 7 via two inverters 2, and the output terminal of the level shift circuit 7 is connected to a gate of the switching transistor ST described later.

Therefore, the output signal PON of the power on reset circuit 5 is time-adjusted by the two inverters 2, then changed to a predetermined potential signal of the same phase with the PON signal (hereinafter, this node is referred to as "PON1") through the level shift circuit 7 with the voltage Vpp, and used as an input signal to the switching transistor ST (FIG. 6) which makes the bit line BL and the plate line PL have the same potential, at the time of power on. In this embodiment, two inverters are used, but the present invention is not limited thereto, or an inverter may not be used.

Moreover, by connecting a boosting circuit 8 to the level shift circuit 7, the switching resistor ST can be switched ON reliably, and though not shown, the voltage applied to the word line WL is also boosted by the boosting circuit. Hence, boosting potential is supplied to the memory cell M via the word line WL, making it possible to switch the memory cell M ON reliably.

Furthermore, the power on reset circuit 5 has a detection circuit which outputs an "H" signal until the predetermined potential supplied to the bit line BL or the plate line PL becomes stable, at the time of power on or returning from the power down mode which adversely affects the memory content of the ferroelectric capacitor C, and after the predetermined potential becomes stable, outputs an "L" signal.

Figure 8:
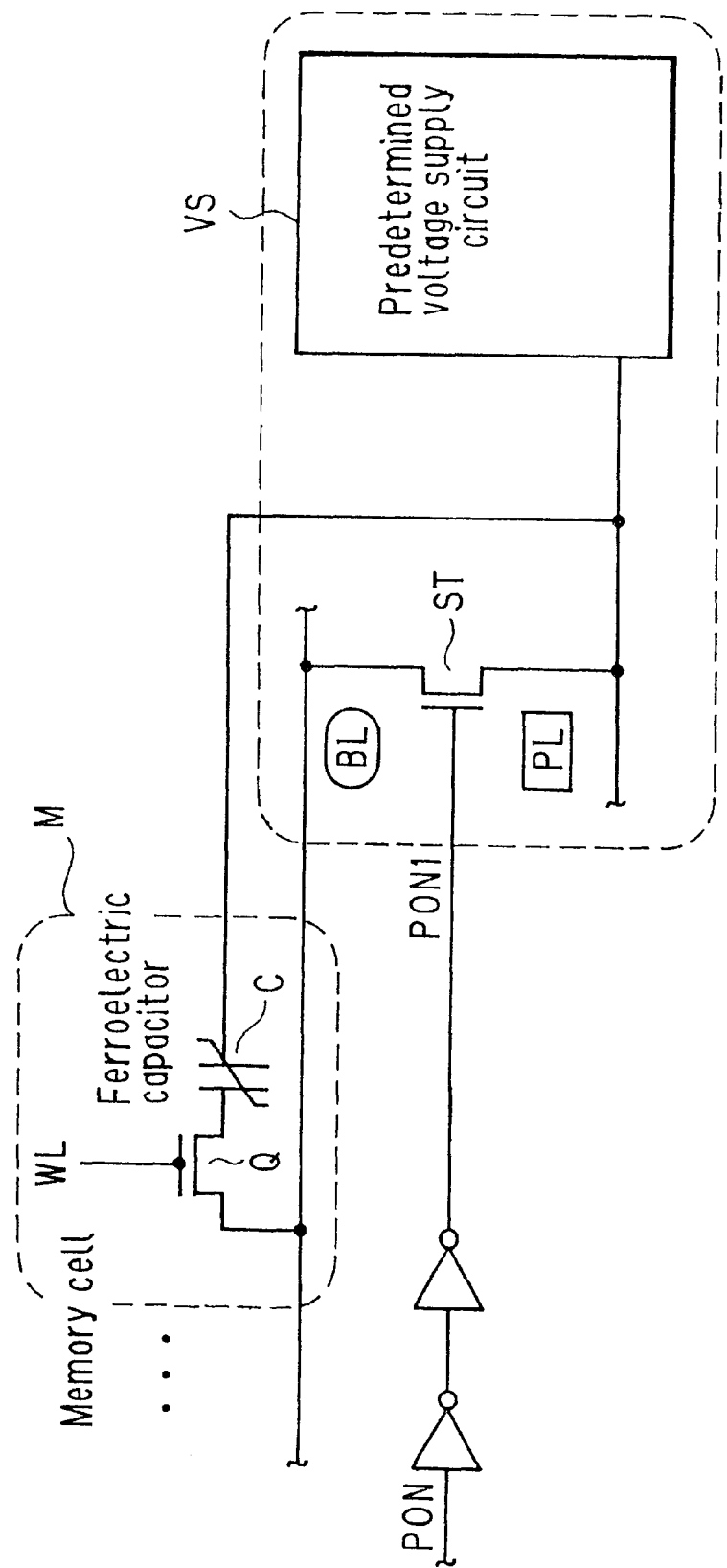
FIG. 8 is a block diagram showing a part of the downstream portion of the semiconductor memory device according to an embodiment of the present invention.

Next is a description of an operation of the memory array based on the above described signal PON1, with reference to a part of the memory cell M, as shown in FIG. 8, for the sake of convenience.

First, at the time of power on, or at the time of returning from the power down mode, as shown in FIG. 7, the "H" signal is output from the power on reset circuit 5, and the P channel transistor QP6 is switched ON by the "L" signal via the inverter 2.

On the other hand, the "L" signal of the row decoder 1 is changed to an "H" signal via the inverter 2, thereby the N channel transistor QN4 is switched ON. Hence, the power supply Vcc is connected to the word line WL through the above described P channel transistor QP6 and the N channel transistor QN4.

As shown in FIG. 8, the word line WL is connected to the gate terminal of the MOS transistor Q constituting the memory cell M. As described above, one of the source or drain of the MOS transistor Q is connected to the bit line BL, and the other is connected to the ferroelectric capacitor C. When a supplementary power supply Vcc (FIG. 7) is applied to the gate terminal through the word line WL, the MOS transistor Q is switched ON, to thereby connect the bit line BL and the ferroelectric capacitor C.

As shown in FIG. 8, the bit line BL and the plate line PL connected to the memory cell M are connected to the source and drain of the switching transistor ST, so that on/off thereof is controlled depending upon the presence or absence of the PON1 signal voltage applied to the gate terminal. If the bit line BL and the plate line PL are electrically connected, both lines BL and PL are charged to the potential supplied from a predetermined voltage supply circuit VS to the plate line PL.

Incidentally, the signal voltage PON1 in FIG. 8 is different from that shown in FIG. 7 in that it is synchronized without being through the level shift circuit 4, and an alternative circuit which does not change the voltage level is used.

As follows is a description of the semiconductor memory device having the above described construction.

First, at the time of power on or at the time of returning from the power down mode, an "H" signal is output from the power on reset circuit 2, as shown in FIG. 7, until the predetermined potential supplied to the bit line BL or the plate line PL becomes stable, and the P channel transistor QP6 is switched ON by an "L" signal via the inverter 2, to thereby apply the supplementary power supply Vcc to the transistor pair 4.

On the other hand, by changing an "L" signal of the row decoder 1 to an "H" signal via the inverter 2, the N channel transistor QN4 is switched ON, thereby the power supply Vcc is connected to the word line WL through the above described P channel transistor QP6 and the N channel transistor QN4. Then, the supplementary power supply Vcc is applied to the gate terminal of the MOS transistor Q, for example, shown in FIG. 8, via the word line WL, hence the MOS transistor Q is ON, to thereby connect the bit line BL and the ferroelectric capacitor C.

Moreover, the signal voltage PON1 from the power on reset circuit 5 is applied to the gate of the switching transistor ST to make the switching transistor conductive, and short circuit occurs between the bit line BL and the plate line PL. Hence, both lines BL and PL are charged to the potential supplied from the voltage supply circuit VS to the plate lin e PL.

Thereby, both poles of the ferroelectric capacitor C for storing the information can be maintained to be the same potential.

After the predetermined potential supplied to the bit line BL or the plate line PL becomes stable, as a PON signal from the power on reset circuit 5, "L" signal is output, the word line WL is connected to the row decoder 1, and the switching transistor ST is switched OFF, thereby enabling normal write, read and the like.

Figure 9:
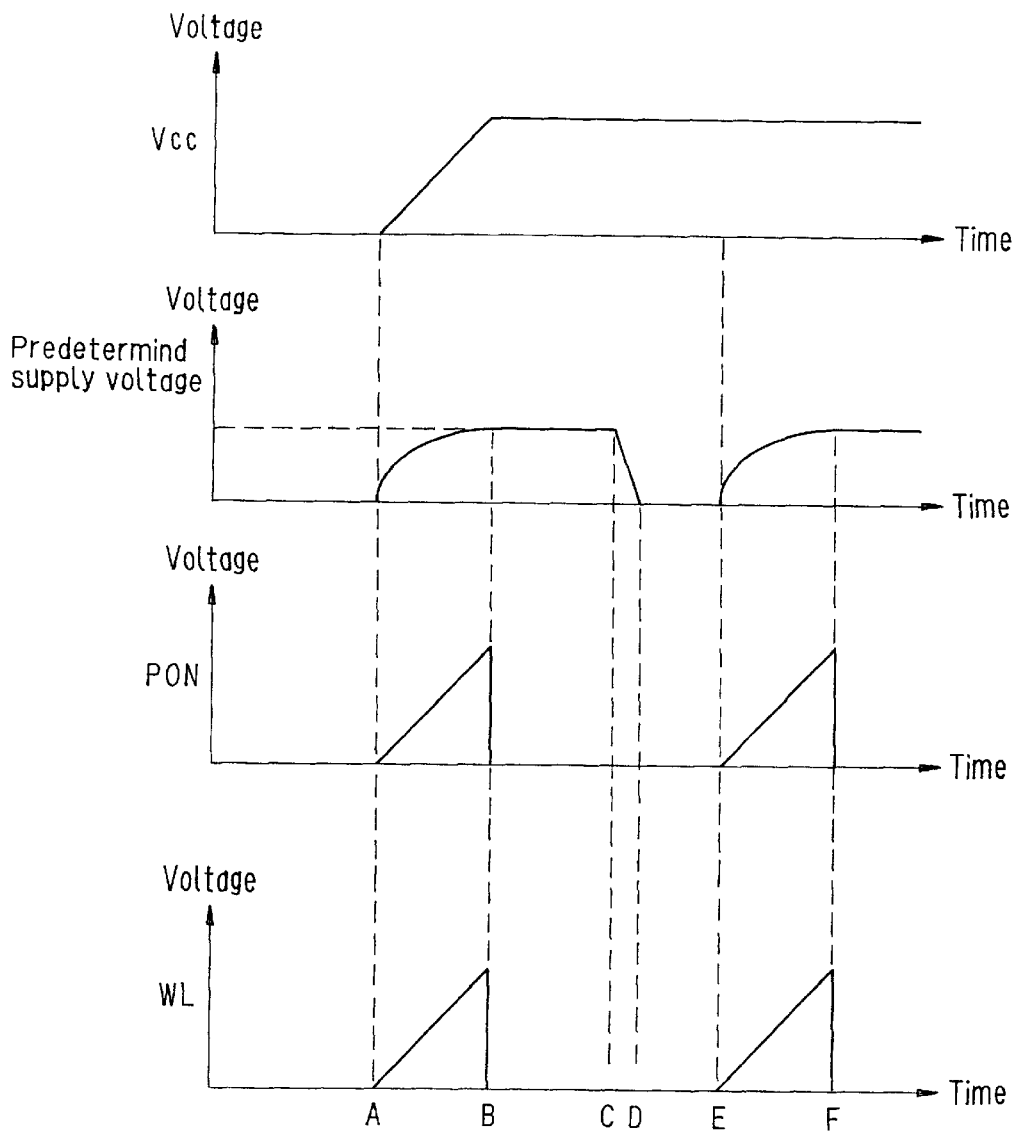
Figure 10:
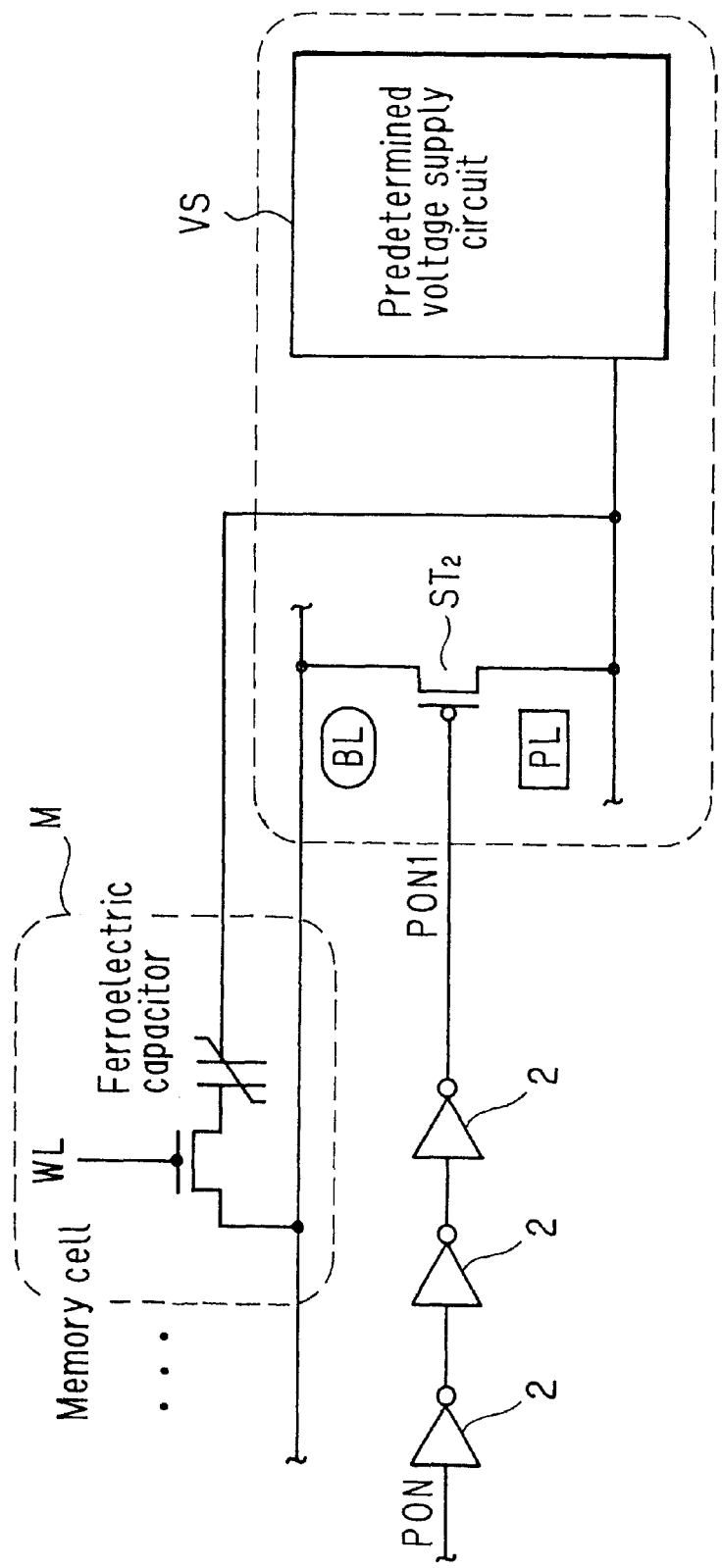
FIG. 10 is a block diagram showing a part of the downstream portion of the semiconductor memory device according to another embodiment of the present invention.
Figure 11:
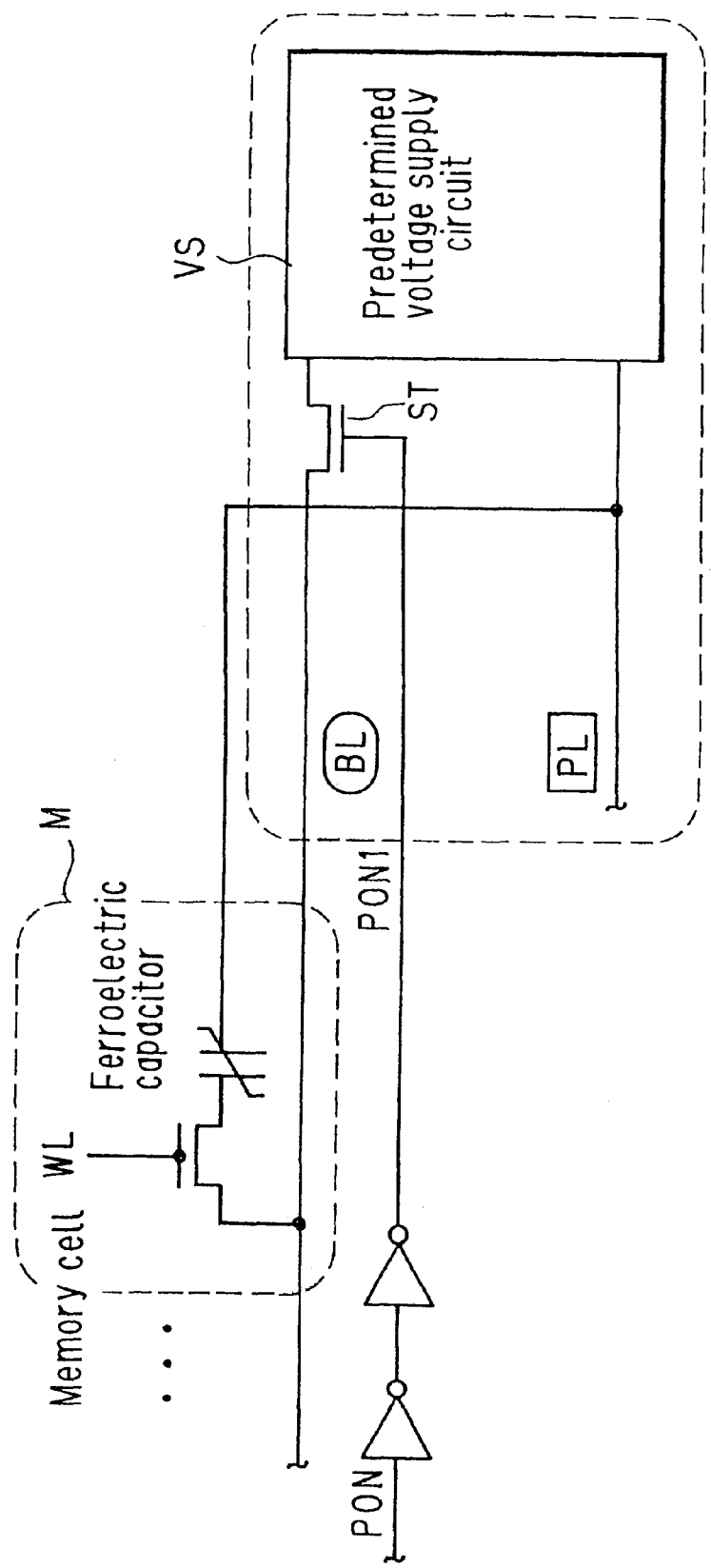
FIG. 11 is a block diagram showing a part of the downstream portion of the semiconductor memory device according to the other embodiment of the present invention.
Figure 12:
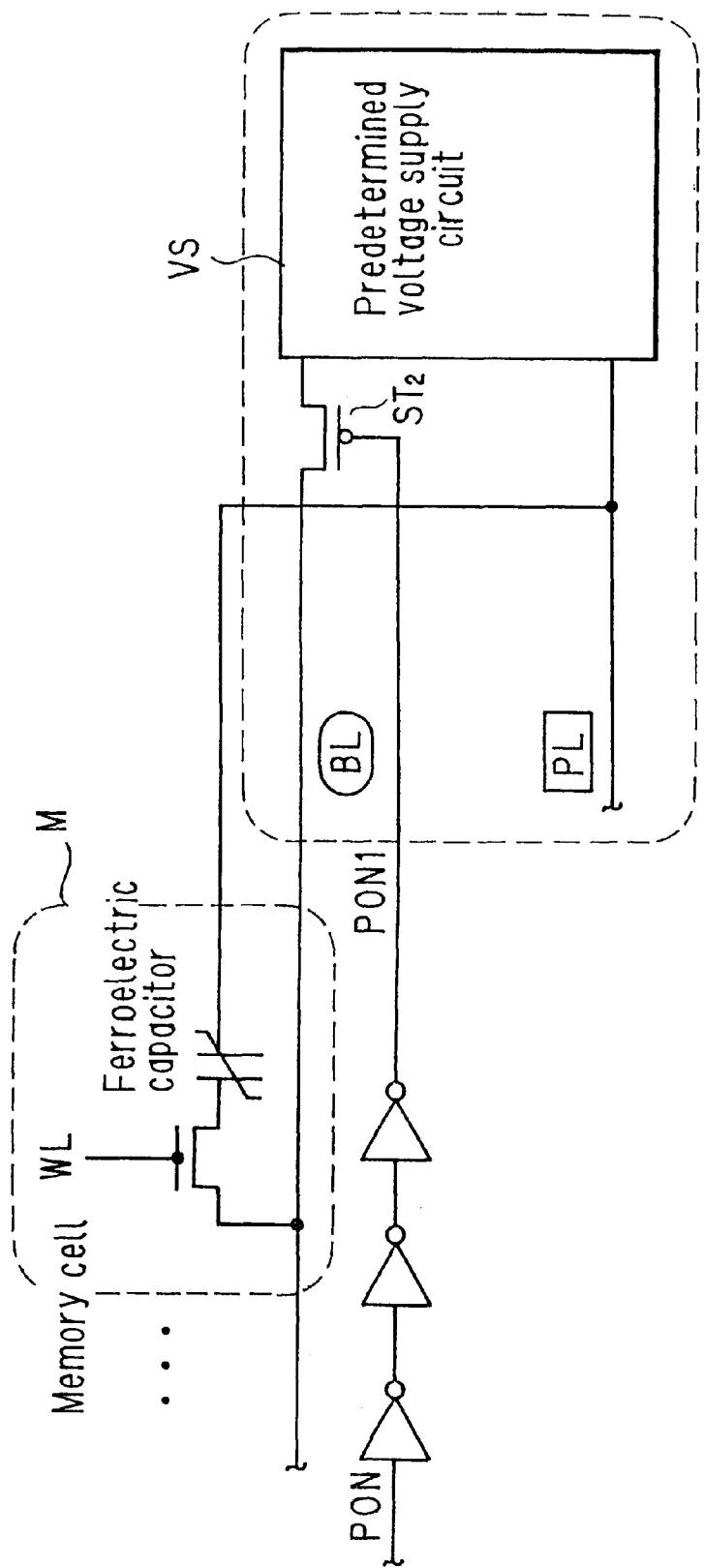
FIG. 12 is a block diagram showing a part of the downstream portion of the semiconductor memory device according to the other embodiment of the present invention.
Figure 13:
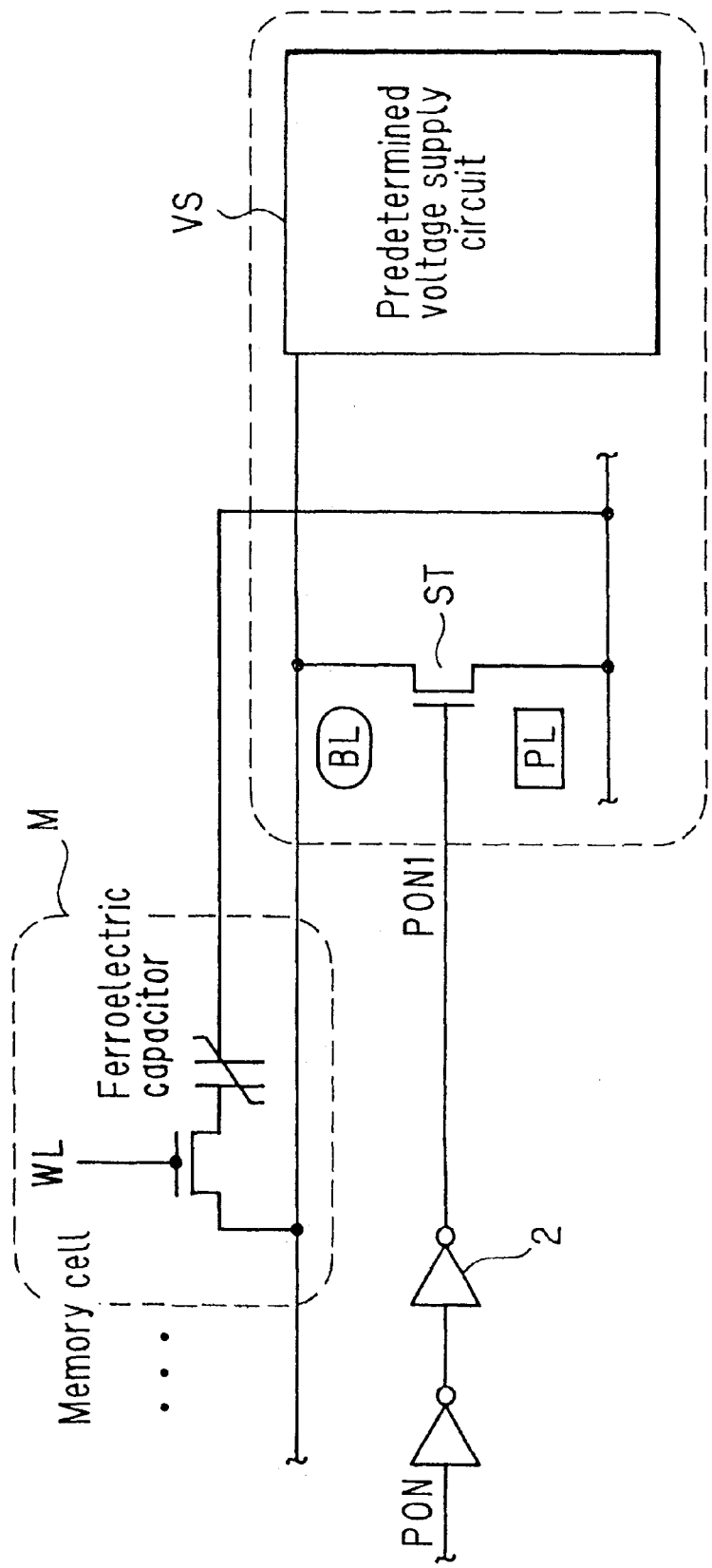
FIG. 13 is a block diagram showing a part of the downstream portion of the semiconductor memory device according to the other embodiment of the present invention.
Figure 14:
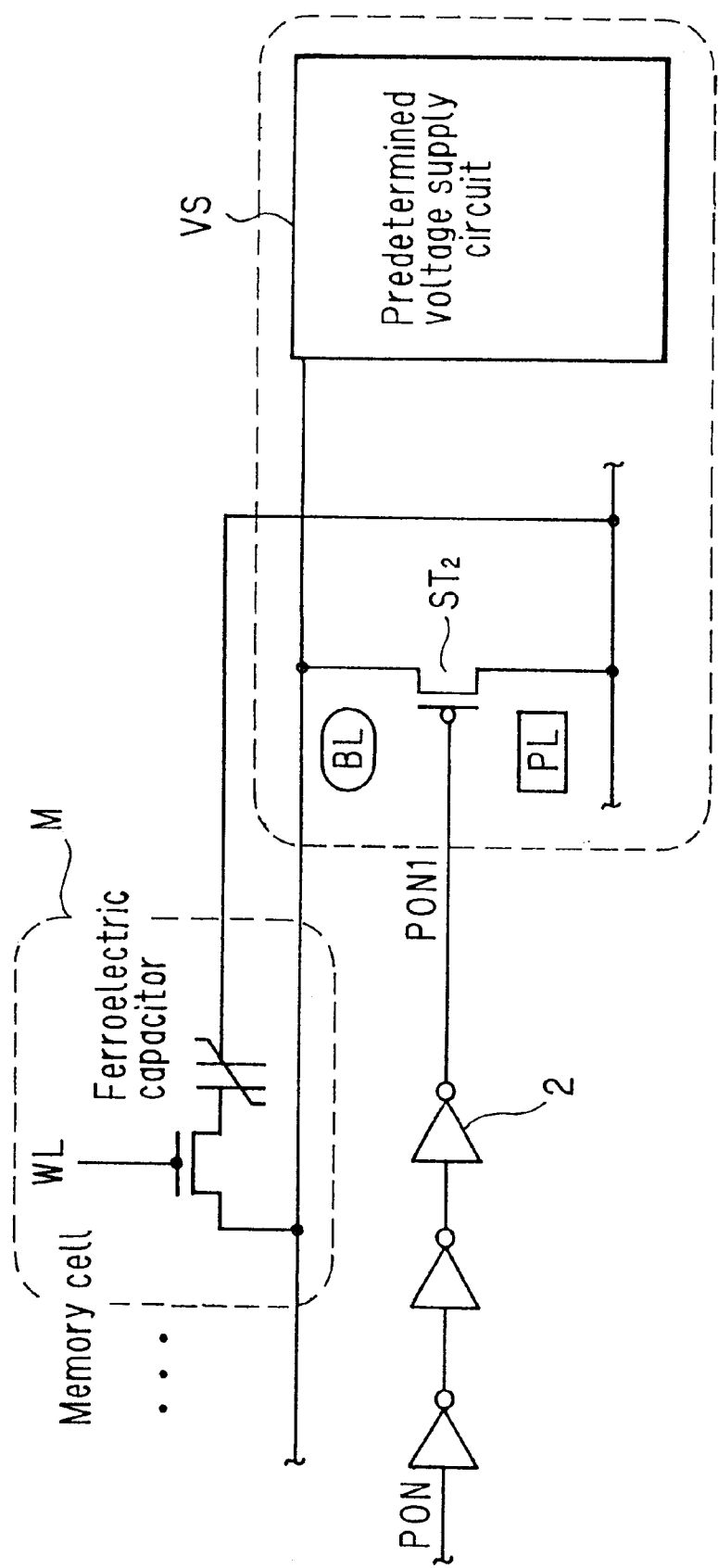
FIG. 14 is a block diagram showing a part of the downstream portion of the semiconductor memory device according to the other embodiment of the present invention.
Figure 15:
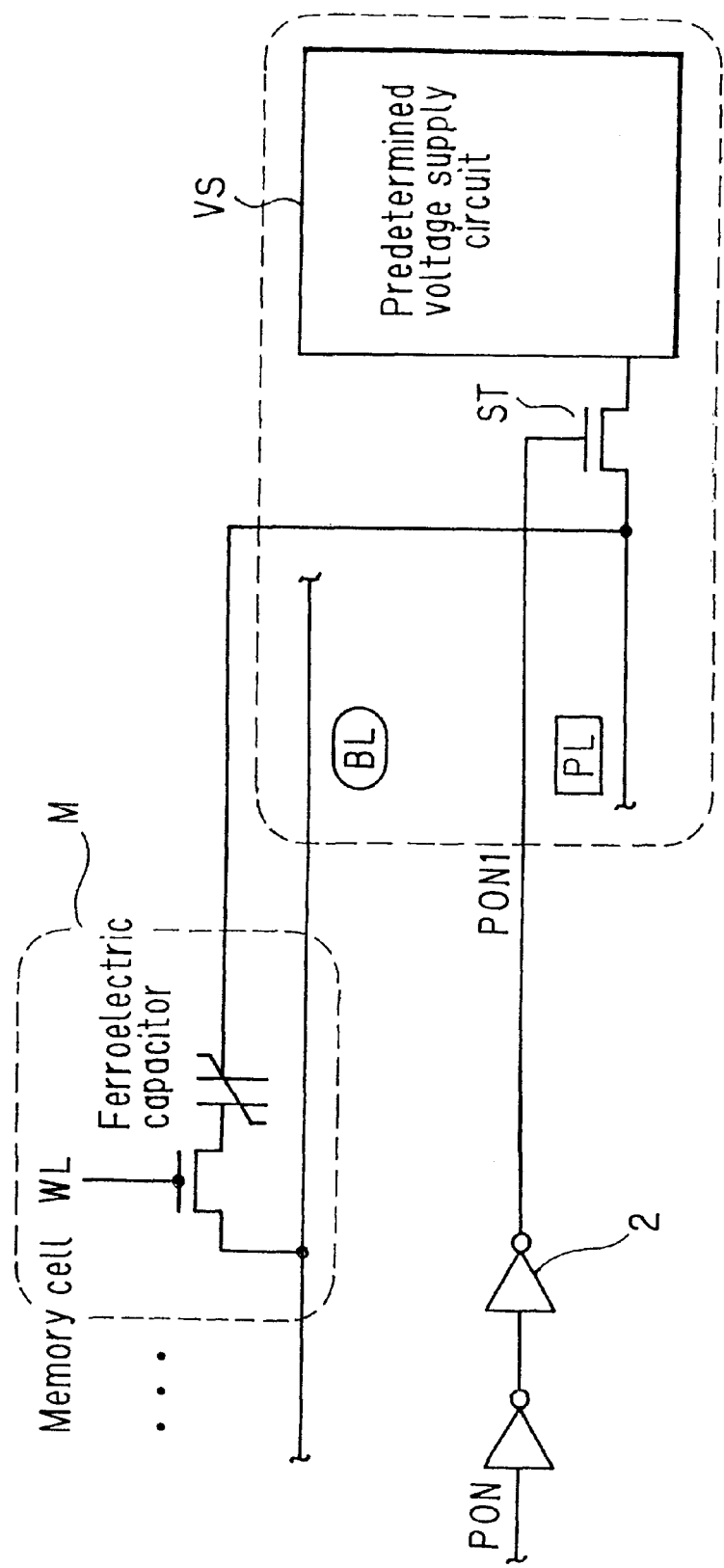
FIG. 15 is a block diagram showing a part of the downstream portion of the semiconductor memory device according to the other embodiment of the present invention.
Figure 16:
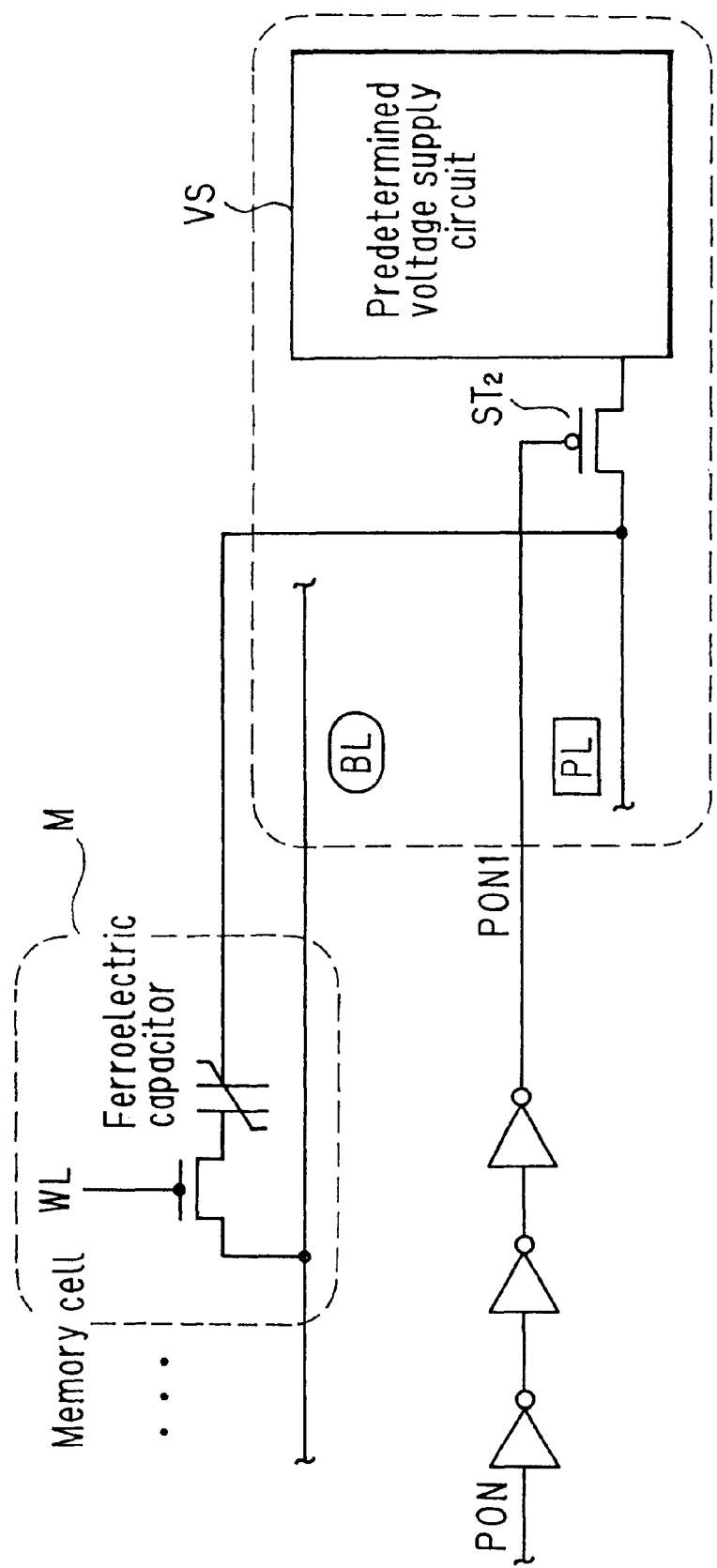
FIG. 16 is a block diagram showing a part of the downstream portion of the semiconductor memory device according to the other embodiment of the present invention.
Figure 17:
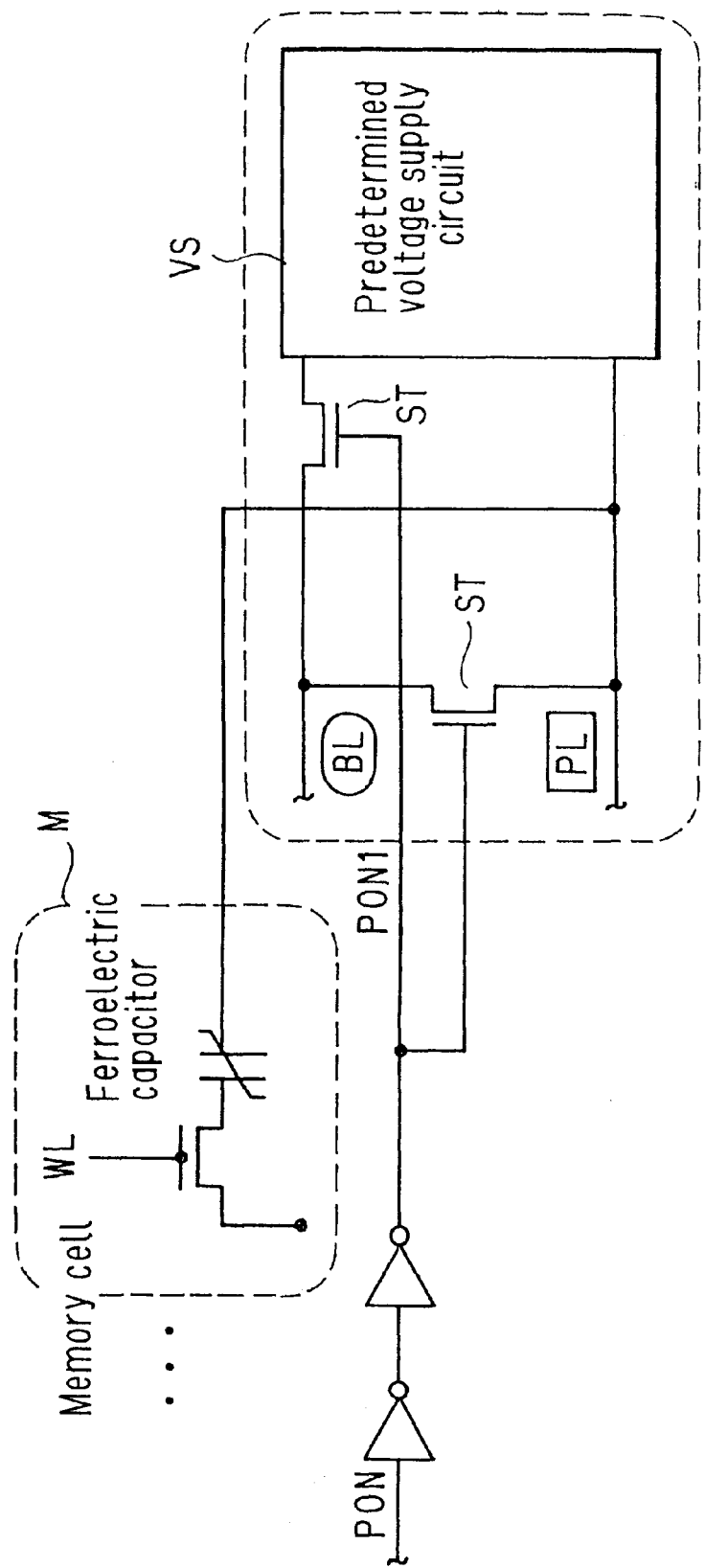
FIG. 17 is a block diagram showing a part of the downstream portion of the semiconductor memory device according to the other embodiment of the present invention.
Figure 18:
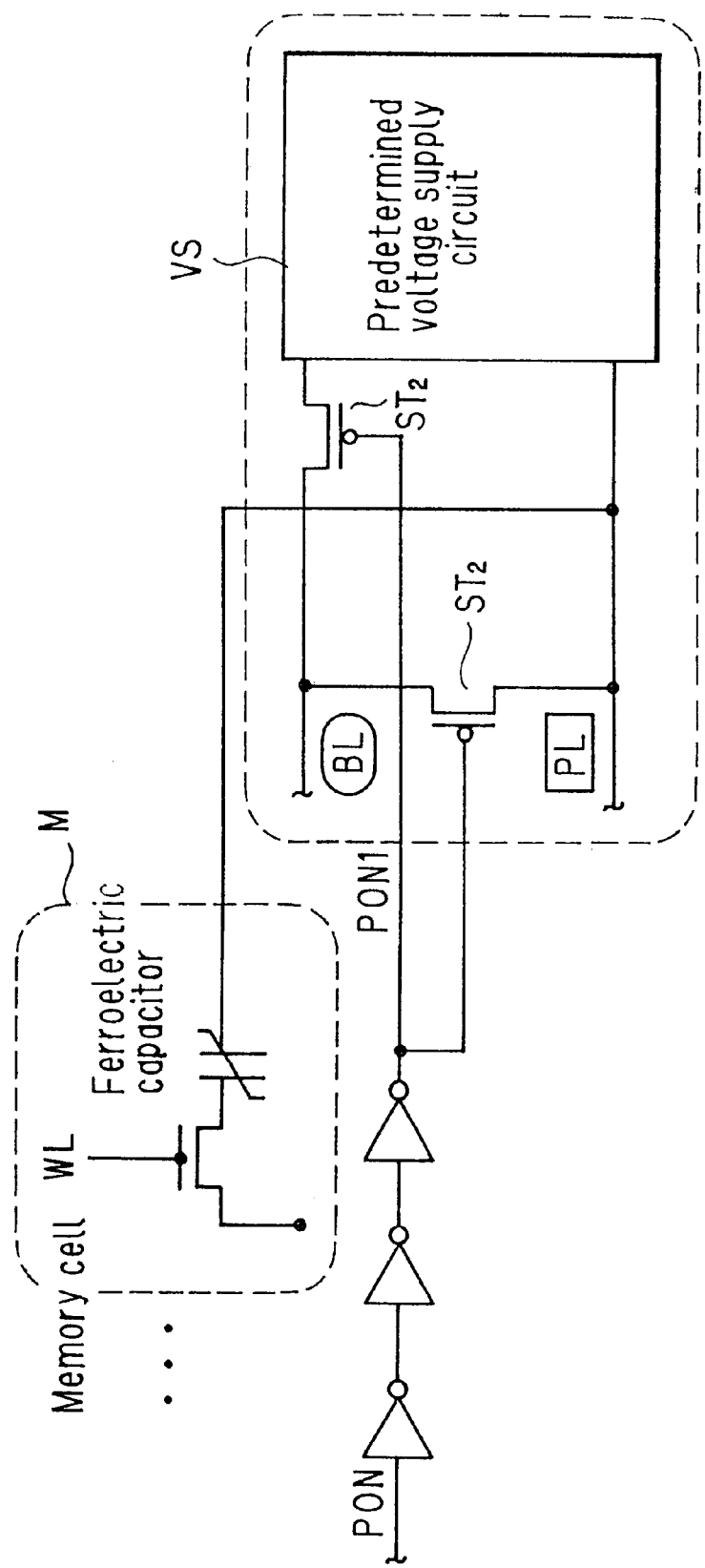
FIG. 18 is a block diagram showing a part of the downstream portion of the semiconductor memory device according to the other embodiment of the present invention.
Figure 19:
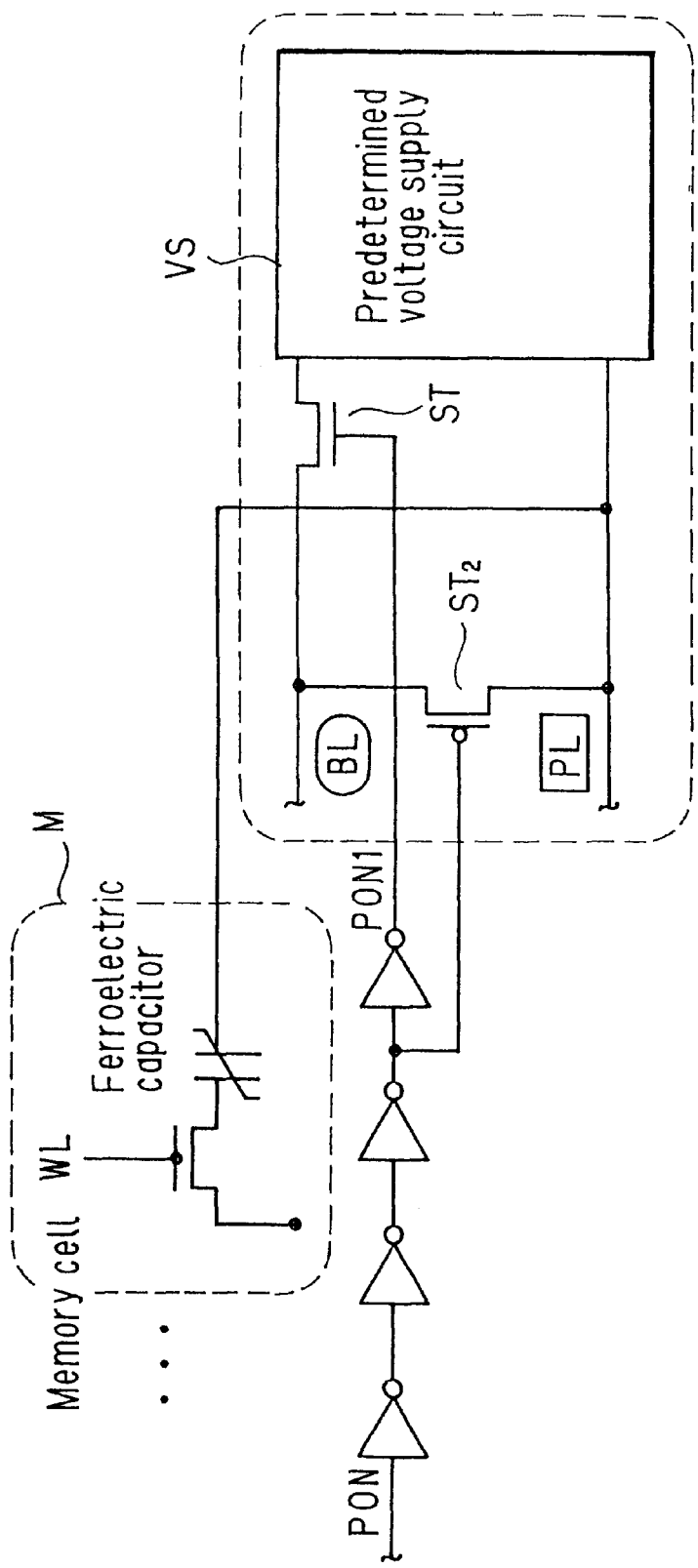
FIG. 19 is a block diagram showing a part of the downstream portion of the semiconductor memory device according to the other embodiment of the present invention.
Figure 20:
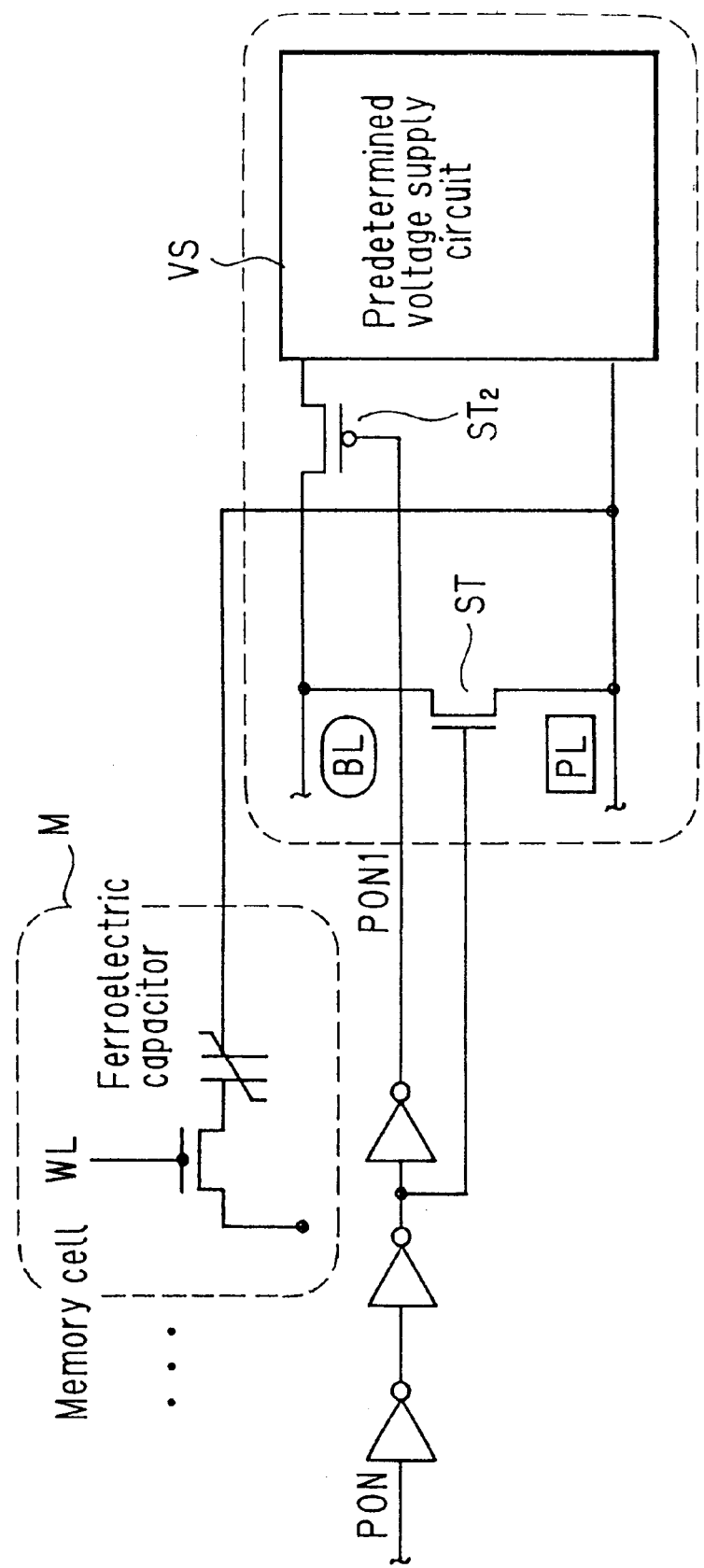
FIG. 20 is a block diagram showing a part of the downstream portion of the semiconductor memory device according to the other embodiment of the present invention.
Figure 21:
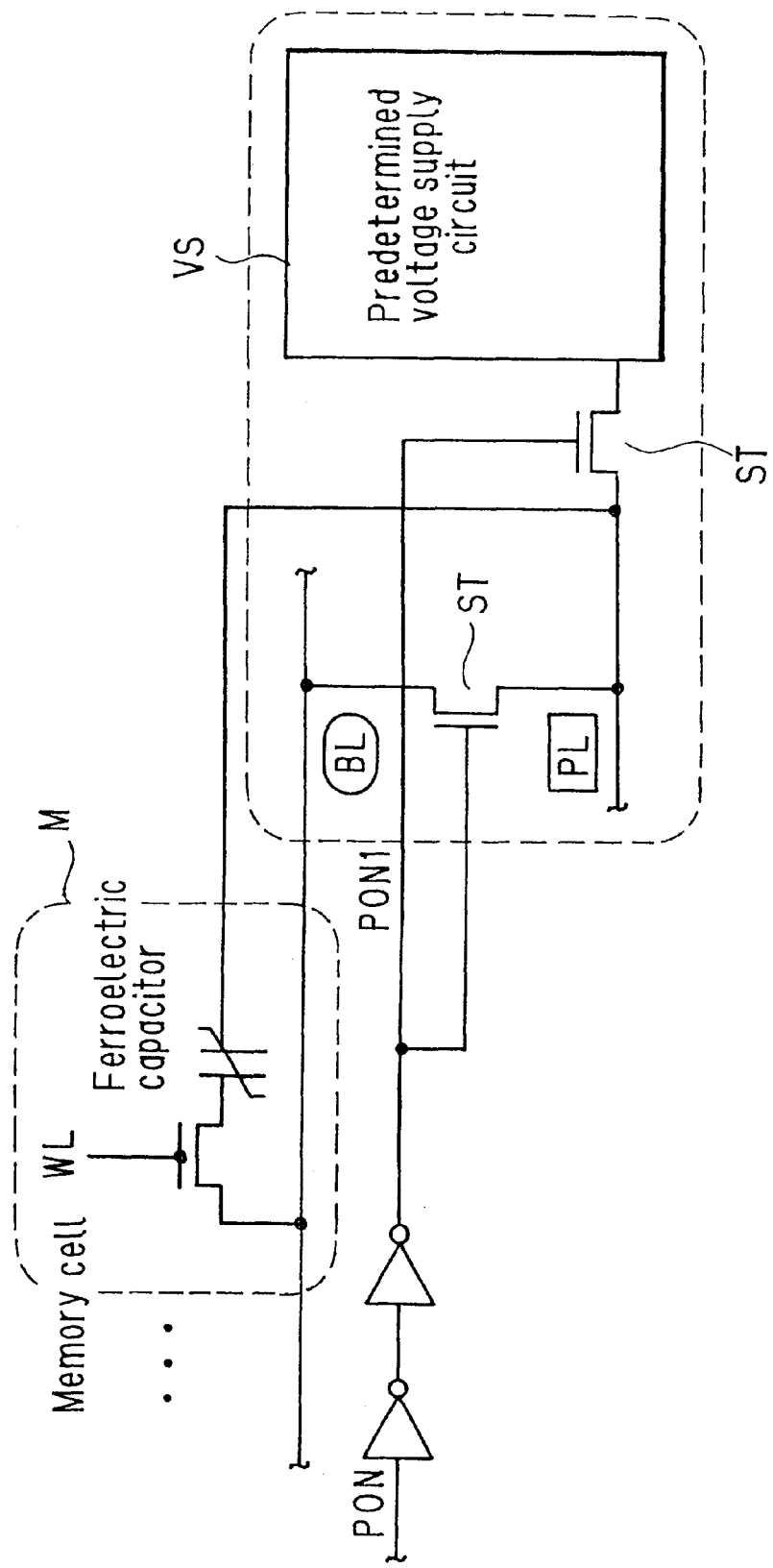
FIG. 21 is a block diagram showing a part of the downstream portion of the semiconductor memory device according to the other embodiment of the present invention.
Figure 22:
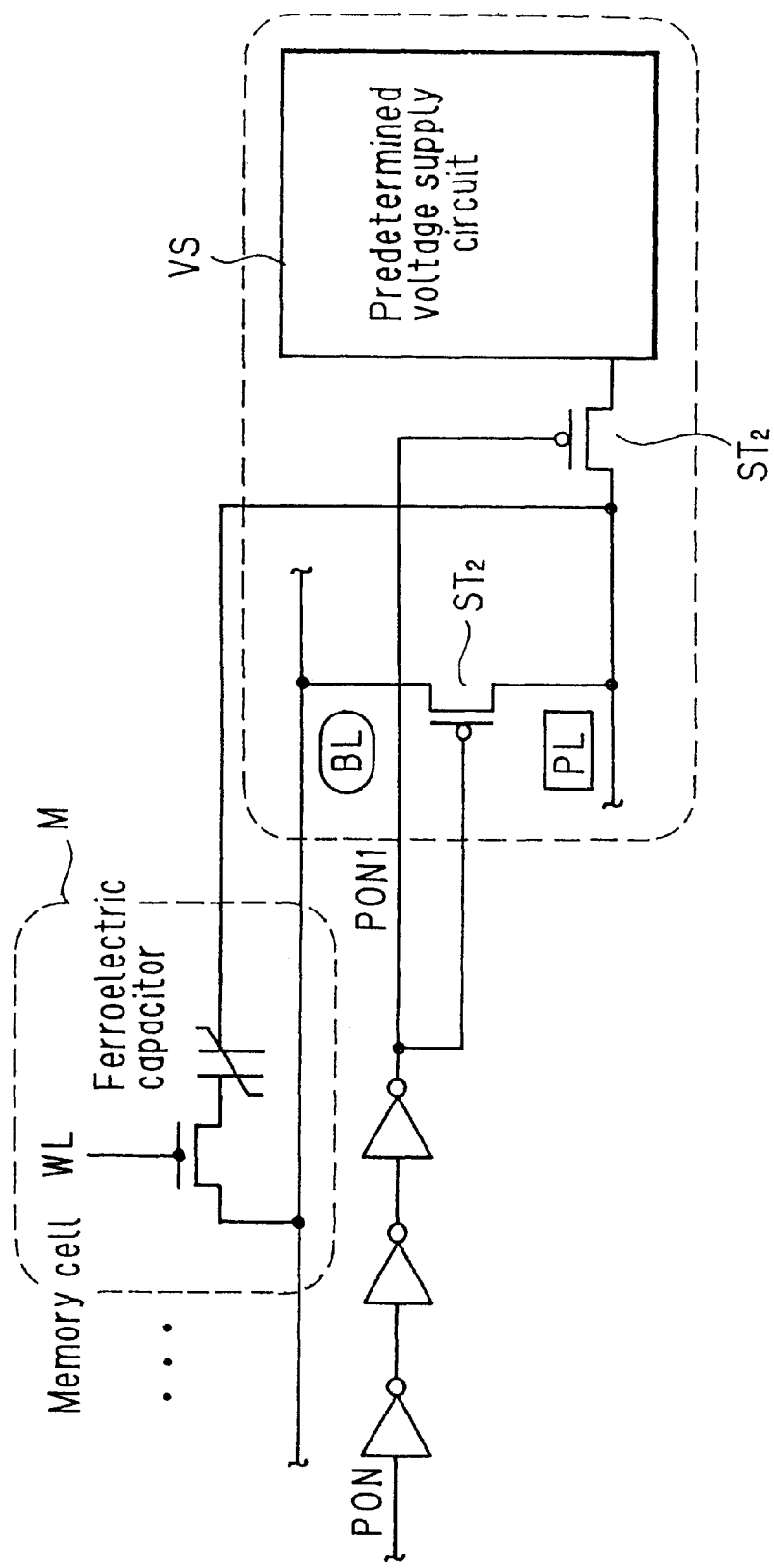
FIG. 22 is a block diagram showing a part of the downstream portion of the semiconductor memory device according to the other embodiment of the present invention.
Figure 23:
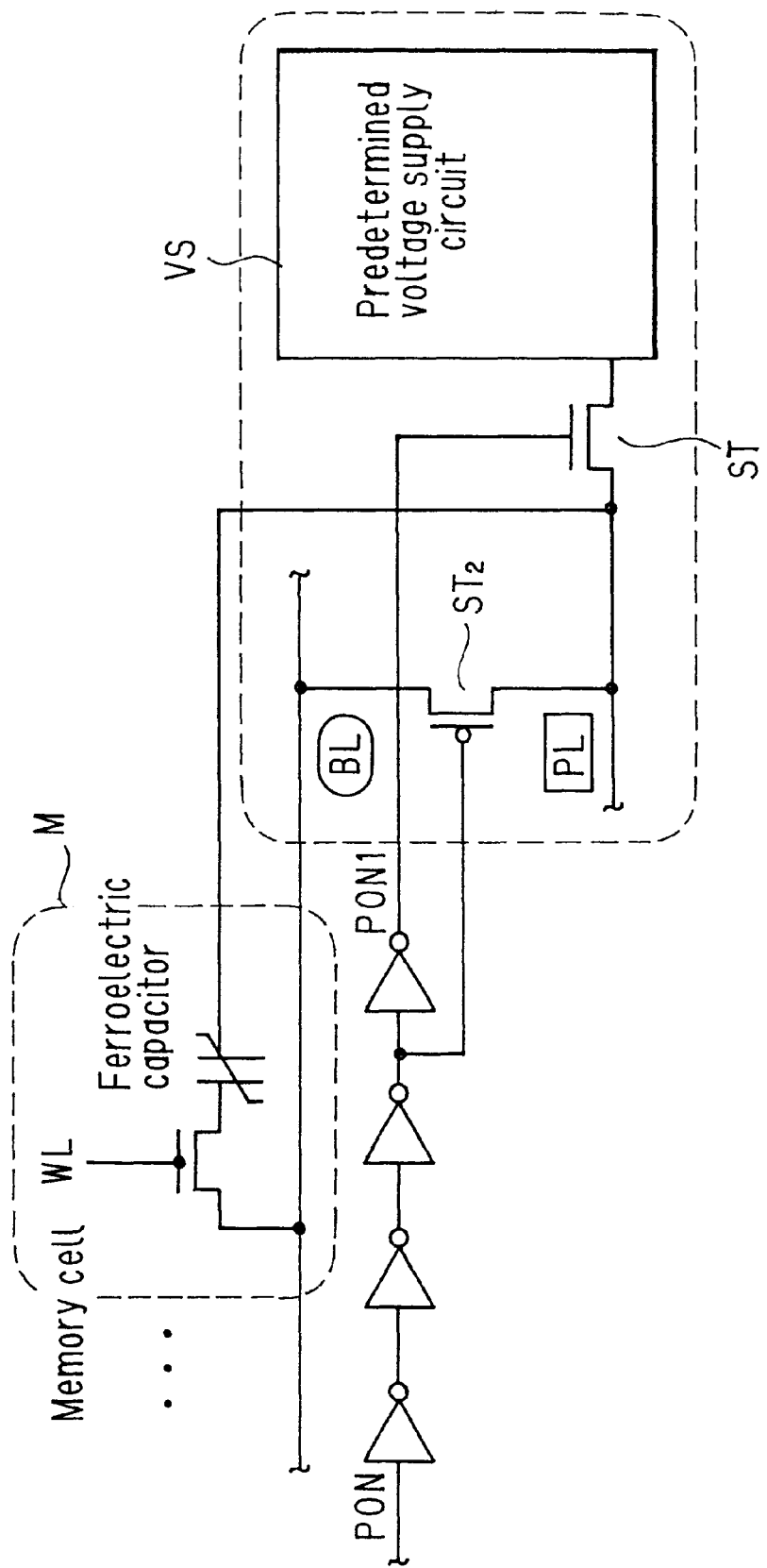
FIG. 23 is a block diagram showing a part of the downstream portion of the semiconductor memory device according to the other embodiment of the present invention.
Figure 24:
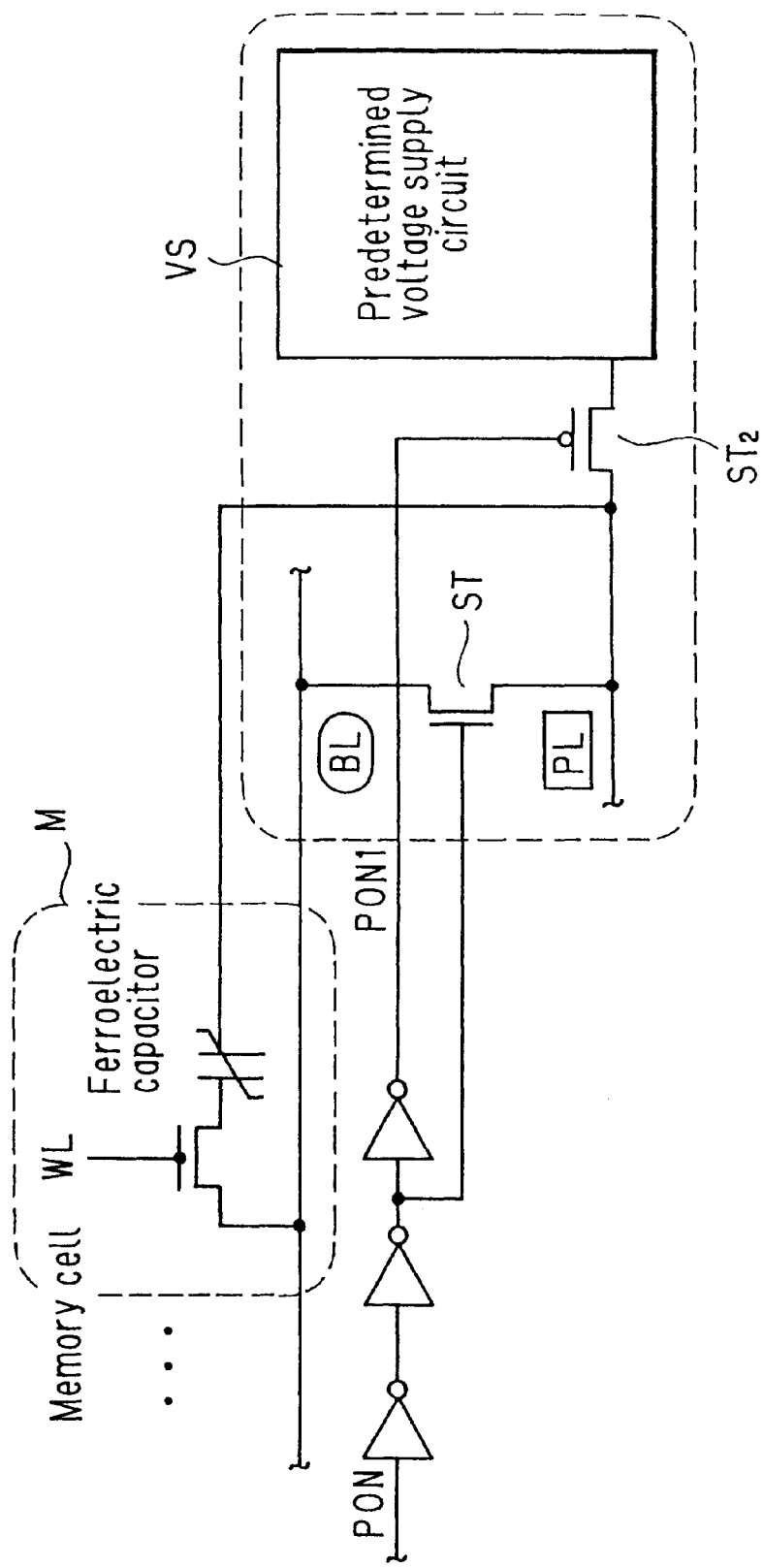
FIG. 24 is a block diagram showing a part of the down stream portion of the semiconductor memory device according to the other embodiment of the present invention.
Figure 25:
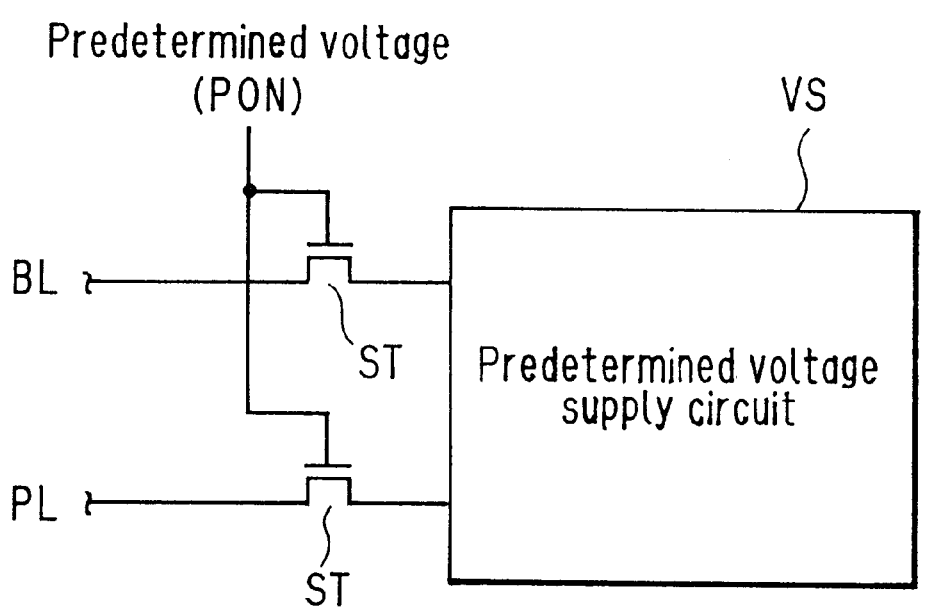
FIG. 25 is a block diagram showing a part of the downstream portion of the semiconductor memory device according to the other embodiment of the present invention.

FIG. 9 shows a time chart of the power supply Vcc, predetermined supply voltage, PON signal voltage and voltage of the word line WL, in an order from up to down in the drawing. Time A on the time axis in the flow chart shown in FIG. 9 shows the time starting the power on, time B shows the time when the power supply voltage and the supplied predetermined voltage become sufficiently stable, and until time B the above described PON signal is output, and the word line is "H". Moreover, time C is the time when the power down mode is started, and time D is the time when the supplied predetermined voltage is discharged to become the ground potential. Time E is the time returning from the power down mode to the operation mode, and time F is the time when the power supply voltage and the supplied predetermined voltage become sufficiently stable, and until time F the above described PON signal is output, and the word line is "H".

According to the embodiment described above, at the time of power on, or at the time of returning from the power down mode, "H" level voltage is applied to at least one of the plurality of word lines, to thereby connect the bit line and one electrode of the ferroelectric capacitor C, as well as when the predetermined potential is supplied to the bit line BL and the plate line PL and the like, the bit line BL and the plate line PL are connected via the switching transistor ST, thereby the bit line BL and the plate line PL become the same potential. Hence, both poles having the potential of the memory retaining node of the ferroelectric capacitor C which is likely to be changed are clamped to the same potential for the above described period. Thereby, inversion of the polarization direction of the ferroelectric film included in the ferroelectric capacitor C at an undesirable timing can be prevented, hence failure of the nonvolatile data stored as the polarization direction can be suppressed.

In the above described embodiment, the description has been given for the preferred example of the present invention, but it is a matter of course that the present invention is not limited thereto.

For example, as shown in FIG. 10 to FIG. 25, changing the type, the place to be attached, and the number of the switching transistors ST is within a scope of design change that can be done by those skilled in the art. For example, there is a case where the bit line BL is connected to the predetermined voltage supply circuit VS, or PMOS type $ST_2$ may be used other than the NMOS type used in the switching transistor.

Moreover, in the above embodiment, the switching transistors ST, $ST_2$ are provided between the bit line BL and the plate line PL, but the switching transistors ST, $ST_2$ are for electrically connecting the bit line BL and the plate line PL, therefore, the switching transistors ST, $ST_2$ may be inserted in series between the bit line BL and the plate line PL, to connect the bit line BL and the plate line PL with the predetermined voltage supply circuit VS (see FIGS. 11, 12, 17, 18, 19, 20 and 25). Furthermore, combining the above described circuits, at least two switching transistors may be provided between the bit line BL and the plate line PL (see FIGS. 17 to 25).

Figure 26:
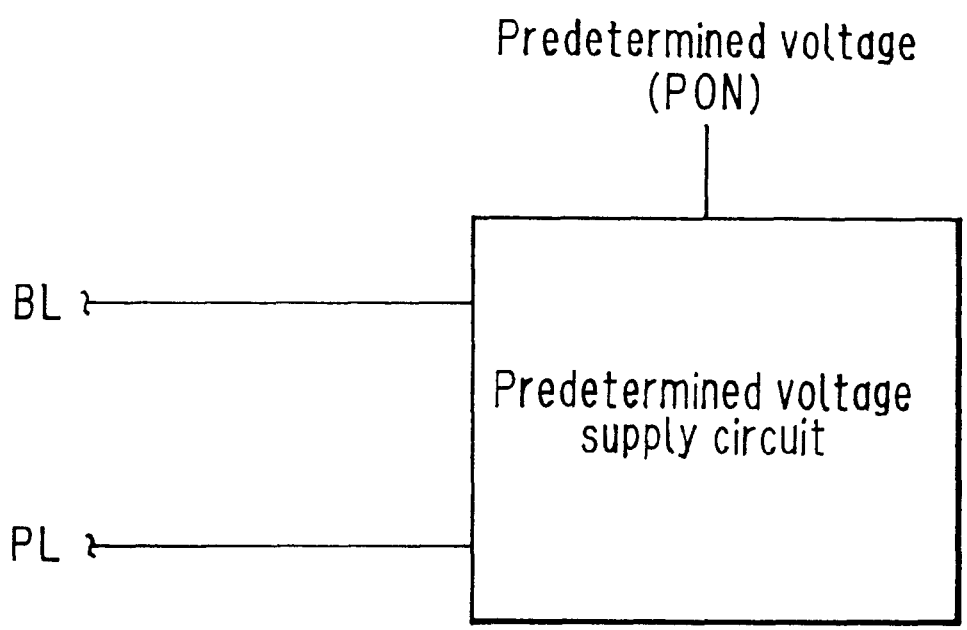
FIG. 26 is a block diagram showing a part of the downstream portion of the semiconductor memory device according to the other embodiment of the present invention.

Furthermore, in the above embodiment, the description has been given for the case where the bit line BL and the plate line PL are directly connected by controlling ON/OFF of the switching transistor, and the case where the same voltage is applied to the bit line BL and the plate line PL from the predetermined voltage supply circuit, but it is possible to make the bit line BL and the plate line PL have the same voltage without using the switching transistor. For example, as shown in FIG. 26, by inputting a power on detection signal (for example, predetermined voltage signal (PON)) to the predetermined voltage supply circuit VS, at the time of power on or at the time of returning from the power down mode, the voltage supply circuit VS is activated (for example, the normal output is in the high impedance state, or the like), to thereby supply the same voltage to the bit line and the plate line for a predetermined period of time, hence the same effect as that of the above described embodiment can be obtained. Incidentally, in FIG. 26, a common voltage supply circuit VS is shown, but the voltage supply circuit VS may be provided separately for the bit line and the plate line.

Moreover, in the above description, as an device which makes the bit line and the plate line have the same potential, the description has been given for the case where the bit line and the plate line are directly connected (short-circuited) by the switching transistor, the case where the same potential is supplied to the both lines from the predetermined voltage supply circuit VS via the switching transistor, and the case where the same potential is supplied to the both lines directly from the predetermined voltage supply circuit VS (not through the switching transistor). Considering various conditions of wiring or the like, and convenience, however, the bit line and the plate line may be made to have the same potential, using these device in combination. According to such an device, an device used for the general-purposes can be obtained.

As described above, according to the present invention, the bit line and one electrode of the memory capacitor are connected by applying "H" level voltage to at least one of the plurality of word lines, at the time of power on or at the time of returning from the power down mode, at the same time, the bit line and the plate line are connected or supplied with the predetermined potential. Hence both poles of the potential of the memory retaining node of the memory capacitor which is likely to be changed are clamped to the same potential. Thereby, inversion of the polarization direction of the ferroelectric film included in the memory capacitor at an undesirable timing can be prevented, hence failure of the nonvolatile data stored as the polarization direction can be suppressed.

Moreover, as the potential control section for controlling the potential of the bit line and the plate line, the bit line and the plate line may be directly connected, or a switching transistor for supplying voltage from the voltage supply circuit to the both lines may be used, or a voltage supply circuit for directly supplying voltage for a predetermined period of time may be used, or a simple device obtained by combining them may be used, hence failure of data in the memory capacitor can be prevented with a simple device.

Furthermore, by using a power on reset circuit as the gate voltage supply section, timing when the MOS transistor is activated, and timing when the potential control section is accessed to make the bit line and the plate line have the same potential can be easily controlled, hence failure of data in the memory capacitor can be prevented with a simple device.

Furthermore, by providing a boosting circuit in the power on reset circuit, the gate voltage supply section and the potential control section can be reliably operated, hence failure of data in the memory capacitor can be prevented reliably.

What is claimed is:

1. A semiconductor memory device comprising:
a plurality of bit lines disposed on a substrate;
a plurality of word lines disposed on the substrate;
a plurality of plate lines disposed on the substrate;
a memory cell array including a plurality of memory cells arranged in a matrix having a plurality of columns and rows; each of the memory cells including at least one MOS transistor and at least one memory capacitor; the memory capacitor including a first capacitor electrode, a second capacitor electrode and a ferroelectric film; the MOS transistor including a gate, a first transistor electrode and a second transistor electrode; the gate of each MOS transistor in a same column being connected to a same word line; each of the MOS transistors in a same row being connected to a same bit line at the first transistor electrode; the second transistor electrode being connected to the memory capacitor at the first capacitor electrode; the plate line being connected to the second capacitor electrode so that a plurality of memory capacitors are selected in the plate line in the column direction or in the row direction;
a gate voltage supply section for supplying, at a time of power on, a predetermined voltage to the gates of the MOS transistors connected to the word line to activate the MOS transistors and to connect the bit line and the first capacitor electrode so that the bit line and the first capacitor electrode have the same potential via the MOS transistor; and
a potential control section which makes the potential of the bit line and the plate line the same so that the first capacitor electrode and the second capacitor electrode have the same potential.

2. A semiconductor memory device comprising:
a plurality of bit lines disposed on a substrate;
a plurality of word lines disposed on the substrate;
a plurality of plate lines disposed on the substrate;
a memory cell array including a plurality of memory cells arranged in a matrix having a plurality of columns and rows; each of the memory cells including at least one MOS transistor and at least one memory capacitor; the memory capacitor including a first capacitor electrode, a second capacitor electrode and a ferroelectric film; the MOS transistor including a gate, a first transistor electrode and a second transistor electrode; the gate of each MOS transistor in a same column being connected to a same word line; each of the MOS transistors in a same row being connected to a same bit line at the first transistor electrode; the second transistor electrode being connected to the memory capacitor at the first capacitor electrode; the plate line being connected to the second capacitor electrode so that a plurality of memory capacitors are selected in the plate line in the column direction or in the row direction;
a gate voltage supply section for supplying a predetermined voltage to the gates of the MOS transistors connected to the word line to activate the MOS transistors and to connect the bit line and the first capacitor electrode via the MOS transistor so that the bit line and the first capacitor electrode have the same potential after power on and when the plate line or the bit line, supplied with a predetermined voltage, is returned from a power down mode for reducing the electric power consumption to an optional predetermined potential, regardless of being at a time of operation or in a standby state; and
a potential control section for making the potential of the bit line and the plate line the same so that the first capacitor electrode and the second capacitor electrode have the same potential.

3. A semiconductor memory device according to claim 1 or 2, wherein the potential control section includes a switching transistor for controlling the conduction of current; and
by supplying a predetermined voltage to the gate of the switching transistor to activate the switching transistor, the bit line and the plate line are connected so that the bit line and the plate line have the same potential.

4. A semiconductor memory device according to claim 3, wherein the gate voltage supply section includes a power on reset circuit for supplying a predetermined output voltage to at least one word line connected to the gate of the MOS transistor, at the time of power on, or for a predetermined period of time since returning from a power down mode, to activate the MOS transistor to thereby connect the bit line and the first capacitor electrode; the power on reset circuit further supplying a predetermined output voltage to the gate of the switching transistor to activate the switching transistor to thereby make the potential of the first capacitor electrode and the second capacitor electrode the same.

5. A semiconductor memory device according to claim 4, wherein the power on reset circuit further includes a boosting circuit for boosting the output voltage up to a power supply voltage or higher.

6. The semiconductor memory device according to claim 3, wherein the potential control section includes:
a voltage supply circuit for supplying a predetermined voltage.

7. The semiconductor memory device according to claim 6, wherein the voltage supply circuit supplies a predetermined voltage to the bit line via the switching transistor.

8. The semiconductor memory device according to claim 6, wherein the voltage supply circuit supplies a predetermined voltage to the plate line via the switching transistor.

9. The semiconductor memory device according to claim 6, wherein the voltage supply circuit supplies a predetermined voltage to the plate line and bit line via the switching transistor.

10. The semiconductor memory device according to claim 6, wherein the voltage supply circuit supplies a predetermined voltage to the bit line and the plate line based on a power on detection signal sent out at the time of power on or at the time of returning from the power down mode.

11. The semiconductor memory device according to claim 6, wherein the potential control section further includes at least a second switching transistor for supplying a voltage from the voltage supply circuit to the bit line.

12. The semiconductor memory device according to claim 11, wherein the voltage supply circuit further supplies a predetermined voltage to the plate line so that the plate line and bit line are at the same potential.

13. The semiconductor memory device according to claim 6, wherein the potential control section further includes at least a second switching transistor for supplying a voltage from the voltage supply circuit to the plate line.

14. The semiconductor memory device according to claim 13, wherein the voltage supply circuit further supplies a predetermined voltage to the bit line so that the plate line and bit line are at the same potential.

15. A semiconductor memory device according to claim 1 or 2, wherein the potential control section includes:
a voltage supply circuit for supplying a predetermined voltage; and
a switching transistor for supplying a voltage from the voltage supply circuit to the bit line;

wherein a predetermined voltage is supplied to a gate of the switching transistor to activate the switching transistor so that the bit line and the plate line have the same potential.

16. A semiconductor memory device according to claim 15, wherein the voltage supply circuit further supplies a predetermined voltage to the plate line so that the bit line and the plate line have the same potential.

17. A semiconductor memory device according to claim 15, wherein the switching transistor further supplies a voltage from the voltage supply circuit to the plate line.

18. A semiconductor memory device according to claim 15, wherein the gate voltage supply section includes a power on reset circuit for supplying a predetermined output voltage to at least one word line connected to the gate of the MOS transistor, at the time of power on, or for a predetermined period of time since returning from the power down mode, to activate the MOS transistor to thereby connect the bit line and the first capacitor electrode; the power on reset circuit further supplying a predetermined output voltage to the gate of the switching transistor to activate the switching transistor to thereby make the potential of the first capacitor electrode and the second capacitor electrode the same.

19. A semiconductor memory device according to claim 15, wherein the power on reset circuit further includes a boosting circuit for boosting the output voltage up to a power supply voltage or higher.

20. A semiconductor memory device according to claim 1 or 2, wherein the potential control section includes:

a voltage supply circuit for supplying a predetermined voltage; and a switching transistor for supplying a voltage from the voltage supply circuit to the plate line;

wherein a predetermined voltage is supplied to a gate of the switching transistor to activate the switching transistor so that the bit line and the plate line have the same potential.

21. A semiconductor memory device according to claim 20, wherein the gate voltage supply section includes a power on reset circuit for supplying a predetermined output voltage to at least one word line connected to the gate of the MOS transistor, at the time of power on, or for a predetermined period of time since returning from the power down mode, to activate the MOS transistor to thereby connect the bit line and the first capacitor electrode; the power on reset circuit further supplying a predetermined output voltage to the gate of the switching transistor to activate the switching transistor to thereby make the potential of the first capacitor electrode and the second capacitor electrode the same.

22. A semiconductor memory device according to claim 21, wherein the power on reset circuit further includes a boosting circuit for boosting the output voltage up to a power supply voltage or higher.

23. A semiconductor memory device according to claim 1 or 2, wherein the potential control section includes a voltage supply circuit for supplying a predetermined voltage to the bit line and the plate line.

24. A semiconductor memory device according to claim 23, wherein the voltage supply circuit supplies a predetermined voltage to the bit line and plate line based on a power on detection signal sent out at the time of power on or at the time of returning from the power down mode, to thereby make the potential of both of the bit line and the plate line the same.

25. A semiconductor memory device according to claim 23 further including a first switching transistor for supplying a predetermined voltage to the bit line from the voltage supply circuit; and a second switching transistor for supplying a predetermined voltage to the plate line from the voltage supply circuit; a predetermined voltage being supplied to the first and second switching transistors to thereby make the potential of both of the bit line and the plate line the same.

26. A semiconductor memory device according to claim 23, wherein the gate voltage supply section includes a power on reset circuit for supplying a predetermined output voltage to at least one word line connected to the gate of the MOS transistor, at the time of power on, or for a predetermined period of time since returning from the power down mode, to activate the MOS transistor to thereby connect the bit line and the first capacitor electrode; the power on reset circuit further supplying a power on detection signal to the voltage supply circuit to supply predetermined voltage to the bit line and the plate line so that the potential of both lines becomes the same.

27. A semiconductor memory device according to claim 26, wherein the power on reset circuit further includes a boosting circuit for boosting the output voltage up to a power supply voltage or higher.

* * * * *